US007751921B2

(12) United States Patent
Sakamoto et al.

(10) Patent No.: US 7,751,921 B2
(45) Date of Patent: Jul. 6, 2010

(54) SEMICONDUCTOR MANUFACTURING APPARATUS, METHOD OF DETECTING ABNORMALITY, IDENTIFYING CAUSE OF ABNORMALITY, OR PREDICTING ABNORMALITY IN THE SEMICONDUCTOR MANUFACTURING APPARATUS, AND STORAGE MEDIUM STORING COMPUTER PROGRAM FOR PERFORMING THE METHOD

(75) Inventors: Koichi Sakamoto, Tokyo-To (JP); Minoru Obata, Tokyo-To (JP); Noriaki Koyama, Tokyo-To (JP)

(73) Assignee: Tokyo Electron Limited, Tokyo (JP)

( * ) Notice: Subject to any disclaimer, the term of this patent is extended or adjusted under 35 U.S.C. 154(b) by 133 days.

(21) Appl. No.: 11/794,374

(22) PCT Filed: Dec. 22, 2005

(86) PCT No.: PCT/JP2005/023617

§ 371 (c)(1),
(2), (4) Date: Sep. 21, 2007

(87) PCT Pub. No.: WO2006/070689

PCT Pub. Date: Jul. 6, 2006

(65) Prior Publication Data

US 2008/0208385 A1 Aug. 28, 2008

(30) Foreign Application Priority Data

Dec. 28, 2004 (JP) ............................. 2004-381364
Feb. 7, 2005 (JP) ............................. 2005-031111
Feb. 15, 2005 (JP) ............................. 2005-038413
Feb. 16, 2005 (JP) ............................. 2005-039869

(51) Int. Cl.
*G06F 19/00* (2006.01)
*G06F 11/30* (2006.01)

(52) U.S. Cl. ..................... 700/108; 702/82; 702/182; 714/48

(58) Field of Classification Search .................. 700/95, 700/108–110; 702/82, 182–185; 714/1, 714/48, 49, 57
See application file for complete search history.

(56) References Cited

U.S. PATENT DOCUMENTS 5,658,423 A 8/1997 Angell et al.
(Continued)

FOREIGN PATENT DOCUMENTS

JP 02-205019 8/1990
(Continued)

OTHER PUBLICATIONS

PCT Notification of Transmittal of Copies of Translation of the International Preliminary Examination Report (Form PCT/IB/338) dated Jan. 2004.
(Continued)

*Primary Examiner*—M. N. Von Buhr
(74) *Attorney, Agent, or Firm*—Smith, Gambrell & Russell, LLP

(57) ABSTRACT

In order to detect an abnormality of semiconductor manufacturing apparatus, a biaxial coordinate system having first and second axes respectively assigned two different monitoring parameters selected from plural apparatus status parameters representing statuses of semiconductor manufacturing apparatus is prepared. As monitoring parameters, for example, a cumulative film thickness for deposition processes that have previously been performed in deposition apparatus and an opening of the pressure control valve located in a vacuum exhaust path to control the internal pressure of a reaction vessel are selected. Values of monitoring parameters obtained when the semiconductor manufacturing apparatus was normally operating are plotted on the biaxial coordinate system. A boundary between a normal condition and an abnormality status is set around a plot group. Values of monitoring parameters obtained during present operation of the semiconductor manufacturing apparatus are plotted on the biaxial coordinate system to determine whether or not there exists an abnormality and identify a type of abnormality based on a positional relation between the plots and the boundary.

9 Claims, 23 Drawing Sheets

U.S. PATENT DOCUMENTS

| | | | |
|---|---|---|---|
| 6,697,691 | B1 | 2/2004 | Miller et al. |
| 6,985,779 | B2 * | 1/2006 | Hsiung et al. ............... 700/19 |
| 7,324,855 | B2 * | 1/2008 | Ushiku et al. ............... 700/83 |
| 2002/0123816 | A1 | 9/2002 | Tanaka et al. |
| 2002/0156549 | A1 | 10/2002 | Hayashi |
| 2003/0100970 | A1 | 5/2003 | Chen |
| 2003/0144746 | A1 * | 7/2003 | Hsiung et al. ............... 700/28 |
| 2004/0073405 | A1 | 4/2004 | Karasawa |
| 2006/0054819 | A1 * | 3/2006 | Nakasuji et al. ............ 250/310 |
| 2006/0073013 | A1 * | 4/2006 | Emigholz et al. ............ 416/35 |
| 2006/0180570 | A1 * | 8/2006 | Mahoney .................. 216/59 |
| 2006/0212145 | A1 * | 9/2006 | Singh et al. ................ 700/83 |
| 2007/0032082 | A1 * | 2/2007 | Ramaswamy et al. ....... 438/689 |
| 2007/0067678 | A1 * | 3/2007 | Hosek et al. ............... 714/25 |
| 2008/0103751 | A1 * | 5/2008 | Hsiung et al. ............... 703/20 |

FOREIGN PATENT DOCUMENTS

| | | |
|---|---|---|
| JP | 09-189290 | 7/1997 |
| JP | 11-054244 | 2/1999 |
| JP | 11-233293 | 8/1999 |

OTHER PUBLICATIONS

PCT International Preliminary Report on Patentability (Form PCT/I B/373) dated Jan. 2004.

Translation of Written Opinion of the International Searching Authority (PCT/ISA/237) dated Jan. 2004.

* cited by examiner

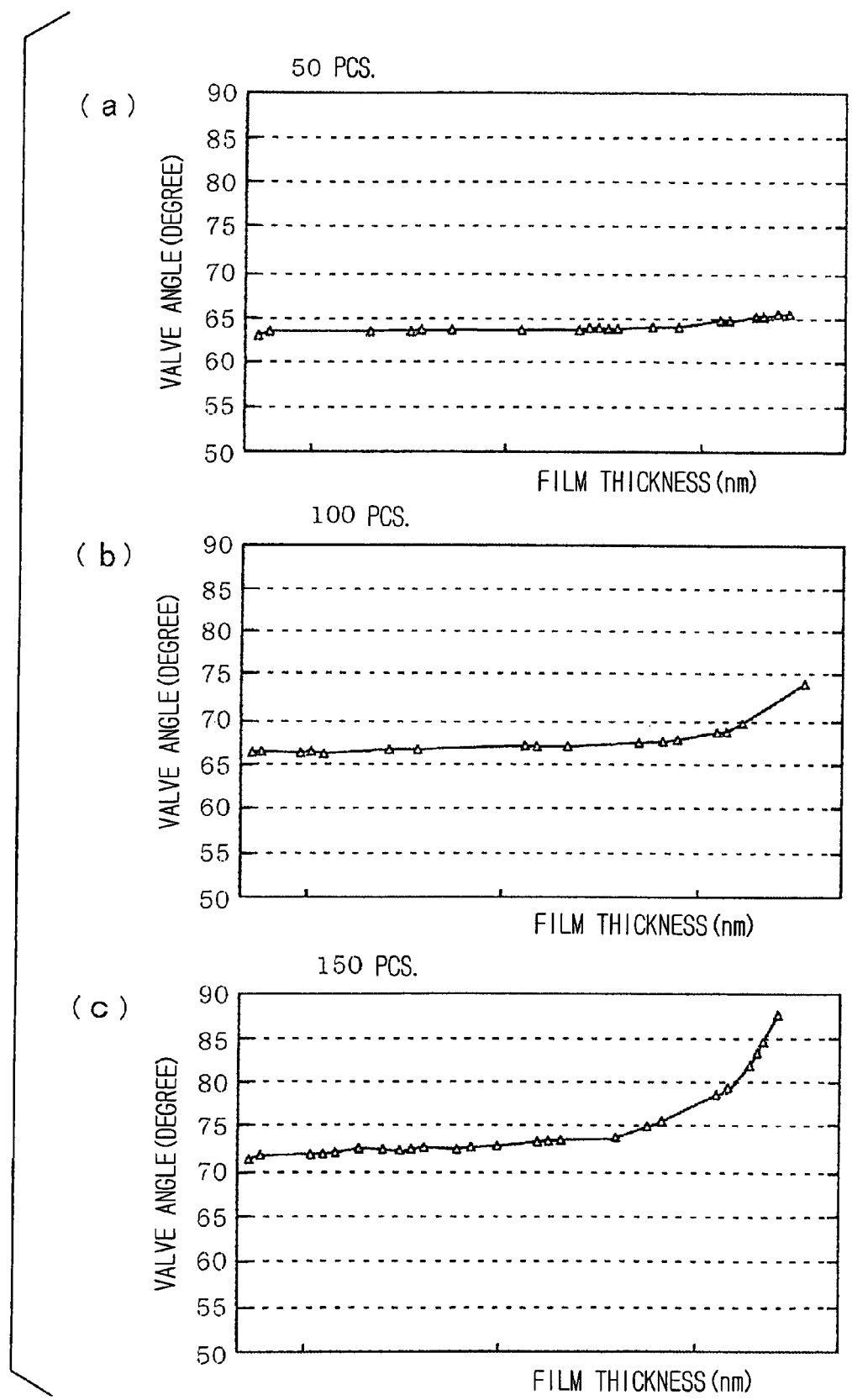
F I G. 9

```
SELECTION    MONITORED ITEM

⊙        EXTERNAL
            TEMPERATURE

⊙        INTERNAL
            TEMPERATURE

⊙        HEATER POWER           EXTERNAL   INTERNAL   HEATER
                                   TEMPERATURE TEMPERATURE POWER

○        PRESSURE                         SEARCH
```

FIG. 17

```
DATA CODE

○ ○ ○

REGIS-
  TRATION

INPUT INFORMATION
  · ABNORMALITY STATUS
  · CAUSE OF ABNORMALITY
  · COUNTERMEASURE
  · COMMENT
```

FIG. 18

SEMICONDUCTOR MANUFACTURING APPARATUS, METHOD OF DETECTING ABNORMALITY, IDENTIFYING CAUSE OF ABNORMALITY, OR PREDICTING ABNORMALITY IN THE SEMICONDUCTOR MANUFACTURING APPARATUS, AND STORAGE MEDIUM STORING COMPUTER PROGRAM FOR PERFORMING THE METHOD

TECHNICAL FIELD

The present invention relates to a semiconductor manufacturing apparatus; a method of detecting an abnormality, identifying a cause of an abnormality, or predicting an abnormality of a component (for example, a pressure control valve or heater of a thermal processing apparatus) in the semiconductor manufacturing apparatus; and a storage medium storing a computer program for performing the method.

BACKGROUND ART

Semiconductor manufacturing apparatuses used to manufacture a semiconductor device, such as a semiconductor integrated circuit, include a thermal processing apparatus that performs film deposition to a semiconductor wafer, a plasma etching apparatus, a liquid processing apparatus that performs resist coating and development, etc. With the recent decrease in the line width and the thickness of a pattern, the yield is largely affected by a slight abnormality occurring in the apparatus. Therefore, it is necessary to detect an abnormality in the apparatus exactly and quickly.

An abnormality of a semiconductor manufacturing apparatus will be explained below referring to a batch-type thermal processing apparatus as an example. In a vertical low-pressure CVD (chemical vapor deposition) apparatus, a holder for holding substrates in a shelf-like manner is loaded into a reaction tube, vacuum pumping is performed through an exhaust pipe while supplying a process gas in the reaction tube, and the inside of the reaction tube is uniformly heated by a heater located around the reaction tube to perform a deposition process. If the airtightness of the reaction tube is degraded, outside air enters the reaction tube disturbing scheduled pressure control and adversely affecting deposition process. Therefore, it is necessary to promptly detecting the abnormality and to perform maintenance. The airtightness may possibly be degraded by a deteriorated resin seal member provided on a lid in the reaction tube or a defective sealing mechanism provided on a revolving shaft passing through the lid.

Pressure control in the reaction tube is performed by controlling the opening of a pressure control valve, such as a butterfly valve, which is provided in the exhaust pipe. If the airtightness in the reaction tube is degraded, it is necessary to discharge an extra amount of air corresponding to the amount of outside air entering into the reaction tube, resulting in an increased opening of the pressure control valve. The opening of the pressure control valve is monitored by a computer. If the opening exceeds a threshold value, the computer judges that the airtightness of the reaction tube has degraded (an abnormality of the apparatus has occurred).

However, since reaction products also adhere to the inner wall surface of the exhaust pipe through the deposition process, the conductance of the exhaust pipe decreases, resulting in an increased opening of the pressure control valve to obtain the same pressure. Therefore, if the cumulative film thickness increases, the opening exceeds the threshold value, and accordingly the computer judges that an apparatus abnormality has occurred. If the threshold value of the opening is set to a large value in order to avoid such misjudgment, a problem of overlooking abnormal airtightness of the reaction tube arises. Furthermore, if the cumulative film thickness excessively increases, the conductance of the exhaust pipe decreases too much, disturbing sufficient evacuation to a predetermined degree of vacuum. Under such a situation, cleaning is required. An alarm for prompting cleaning is made if the valve opening exceeds a predetermined threshold value. However, as mentioned above, if abnormal airtightness of the reaction tube occurs, there arises a problem that the valve opening exceeds the threshold value for judgment criteria of cleaning.

The foregoing problems of abnormality detection may occur also in other portions. Conventionally, the heater composed of resistance heating elements arranged around the reaction tube has been replaced after a predetermined operating hour has elapsed. However, if the heater fails before the predetermined operating hour has elapsed, thermally processed wafers will become defective. Since a 12-inch size wafer is very expensive, economical loss is large. Furthermore, the heater of the batch-type furnace is expensive because not only of the constituent material having high durability and low contamination but also of an increased size with increasing diameter of substrates. On the other hand, a heater maker determines a guaranteed operating hour with a certain margin. Actually, in many cases, the heater is replaced in spite of its remaining life, resulting in an increased running cost of the apparatus.

As mentioned above, such a semiconductor manufacturing apparatus has a problem that a defective component thereof cannot certainly be detected and therefore an operable component is replaced or maintained on an early stage.

JP2002-352938A discloses a method of predicting a life of a heater for a vertical thermal processing apparatus. However, the method disclosed here can determine an abnormality based on a tendency of variation in a power value that has been monitored for a prolonged period of time; the method can neither detect an apparatus failure in real time or almost in real time nor determine correctly whether a failure occurred in the heater itself or in other component parts.

DISCLOSURE OF THE INVENTION

The present invention has been made in view of the foregoing circumstances, and it is therefore an object of the present invention to certainly detect or predict an abnormality of a component of semiconductor manufacturing apparatus.

Anther object of the present invention is to detect or predict the abnormality while identifying a component part in which abnormality occurs.

Still another object of the present invention is to identify the cause of an abnormality and/or a countermeasure against the abnormality.

To be very schematic, the present invention utilizes a correlation of at least two parameters selected from a plurality of apparatus status parameters representing statuses of semiconductor manufacturing apparatus to makes it possible to reliably detect an abnormality, identify the cause of the abnormality, or predict the abnormality.

According to the present invention, there is provided a semiconductor manufacturing apparatus that performs a process to a substrate to fabricate a semiconductor device, the apparatus including: a boundary data storage unit that stores boundary data defining a boundary between a normal region and an abnormal region on a biaxial coordinate system, the coordinate system having a first axis and a second axis respectively assigned a first monitoring parameter and a second monitoring parameter that varies according to a correlation with the first monitoring parameter, the first and second monitoring parameters being selected from a plurality of apparatus status parameters representing statuses of said semiconductor manufacturing apparatus; first and second monitoring means for monitoring the first and second monitoring parameters, respectively; judgment means for judging whether a position, on the biaxial coordinate system, of a combination of values of the first and second monitoring parameters respectively obtained by the first and second monitoring means is included in the normal region or in the abnormal region; and abnormality alarming means for alarming that there exists an abnormality in the semiconductor manufacturing apparatus if the judgment means determines that the position is included in the abnormal region.

The present invention also provides a method of detecting an abnormality of a semiconductor manufacturing apparatus, including the steps of: acquiring a value of a first monitoring parameter and a value of a second monitoring parameter which varies according to a correlation with the first monitoring parameter, the first and second monitoring parameters being selected from a plurality of apparatus status parameters representing statuses of the semiconductor manufacturing apparatus; applying the values, thus obtained, of the first and second monitoring parameters to boundary data that specifies a boundary between a normal region and an abnormal region on a biaxial coordinate system having a first axis and a second axis respectively assigned the first and second monitoring parameters, and judging whether a position, on a biaxial coordinate system, of the obtained values of the first and second monitoring parameters are included in the normal region or the abnormal region; and alarming that there exists an abnormality in the semiconductor manufacturing apparatus if the judgment means judges that the positions are included in the abnormal region. Furthermore, the present invention also provides a storage medium storing a program for performing the foregoing method. When a computer connected to the semiconductor manufacturing apparatus executes the computer program, the computer controls the semiconductor manufacturing apparatus to perform the method.

Furthermore, the present invention provides a semiconductor manufacturing apparatus that performs a process to a substrate to fabricate a semiconductor device, said apparatus comprising: a plurality of monitoring means for respectively monitoring a plurality of monitoring parameters selected from a plurality of apparatus status parameters representing statuses of the semiconductor manufacturing apparatus; abnormality detection means for detecting an abnormality of the semiconductor manufacturing apparatus based on at least one of values of the plurality of monitoring parameters; abnormality judgment data storage unit that stores a plurality of abnormality judgment data, wherein the abnormality judgment data is constituted by associating abnormality data with a corresponding cause of the abnormality, the abnormality data being composed of a combination of at least two of values of the plurality of monitoring parameters appearing if an abnormality occurs in the semiconductor manufacturing apparatus; abnormality data creation means for creating abnormality data including a combination of monitored values of at least two monitoring parameters which are selected from the plurality of monitoring parameters and relate to the abnormality, if an abnormality of the semiconductor manufacturing apparatus is detected by the abnormality detection means; and searching means for searching, from among the abnormality judgment data stored in the abnormality judgment data storage unit, abnormality data coinciding with or resembling to a predetermined extent or more the abnormality data created by the abnormality data creation means, and for reading out the abnormality judgment data if such coincident or resembling abnormality data exists, allowing a cause of the abnormality to be identified.

Furthermore, the present invention provides a method of detecting an abnormality of a semiconductor manufacturing apparatus and identifying a cause of the abnormality, said method comprising the steps of: detecting an abnormality of the semiconductor manufacturing apparatus based on a monitored value of at least one monitoring parameter selected from a plurality of apparatus status parameters representing statuses of the semiconductor manufacturing apparatus; creating abnormality data consisting of a combination of monitored values of at least two monitoring parameters relating to the abnormality if the abnormality of the semiconductor manufacturing apparatus is detected; searching, from among a plurality of abnormality judgment data stored in an abnormality judgment data storage unit, abnormality data coinciding with or resembling to a predetermined extent or more the created abnormality data, wherein the abnormality judgment data is constituted by associating abnormality data, which consists of a combination of at least two of the plurality of monitoring parameter values and appears when the abnormality occurs in the semiconductor manufacturing apparatus, with a corresponding cause of the abnormality; and reading out the cause of the abnormality included in the abnormality judgment data if there exists abnormality judgment data including the abnormality data coinciding with or resembling to a predetermined extent or more the created abnormality data. Furthermore, the present invention also provides a storage medium storing a program for performing the foregoing method. When a computer connected to the semiconductor manufacturing apparatus executes the computer program, the computer controls the semiconductor manufacturing apparatus to perform the method.

Furthermore, the present invention provides a deposition apparatus, which includes a reaction vessel, a vacuum exhaust path connected to the reaction vessel, and a pressure control valve provided in the vacuum exhaust path to control an internal pressure of the reaction vessel by controlling an opening of the valve, that performs a deposition process to a substrate in the reaction vessel in a reduced-pressure atmosphere, said deposition apparatus comprising: an opening detector that detects the opening of the pressure control valve; a cumulative film thickness management unit that calculates a cumulative film thickness at an end of a present deposition process based on a target film thickness of the present deposition process and a cumulative film thickness of a thin film formed in deposition processes that have previously been performed by the semiconductor manufacturing apparatus; a process data storage unit that stores previous process data including, as items, values of cumulative film thickness in deposition processes that have previously been performed and values of the opening the pressure control valve corresponding to the cumulative film thickness; and judgment means for predicting an opening of the pressure control valve in the present deposition process based on previous process data stored in the process data storage unit and a value of the calculated cumulative film thickness at the end of the present deposition process, and for judging whether or not the opening of the pressure control valve thus predicted exceeds a predetermined threshold value.

Furthermore, the present invention provides a method of predicting an abnormality of a semiconductor manufacturing apparatus, comprising the steps of: calculating a cumulative film thickness at an end of a present deposition process based on a target film thickness of the present deposition process and a cumulative film thickness of a thin film formed in deposition processes that have previously been performed by the semiconductor manufacturing apparatus; predicting an opening of a pressure control valve corresponding to the cumulative film thickness at the end of the present deposition process based on previous process data including, as items, values of cumulative film thickness in deposition processes that have previously been performed and opening values of the pressure control valve corresponding to the cumulative film thickness; and judging whether or not the predicted value exceeds a threshold value. Furthermore, the present invention also provides a storage medium storing a program for performing the foregoing method. When a computer connected to the semiconductor manufacturing apparatus executes the computer program, the computer controls the semiconductor manufacturing apparatus to perform the method.

Advantageous embodiments of the present invention will become apparent from the dependent claims and the description of preferred embodiments made with reference to the accompanying drawings.

BRIEF DESCRIPTION OF DRAWINGS

FIG. 9 is a graph showing a relation between the cumulative film thickness and valve angle for each of different batch sizes.

FIG. 17 is a diagram showing display of a display unit when creating abnormality data.

FIG. 18 is a diagram showing display of a display unit when registering new abnormality judgment data.

BEST MODE FOR CARRYING OUT THE INVENTION

The present invention will be explained in detail below with reference to suitable embodiments shown in the accompanying drawings.

First Embodiment

Figure 1:
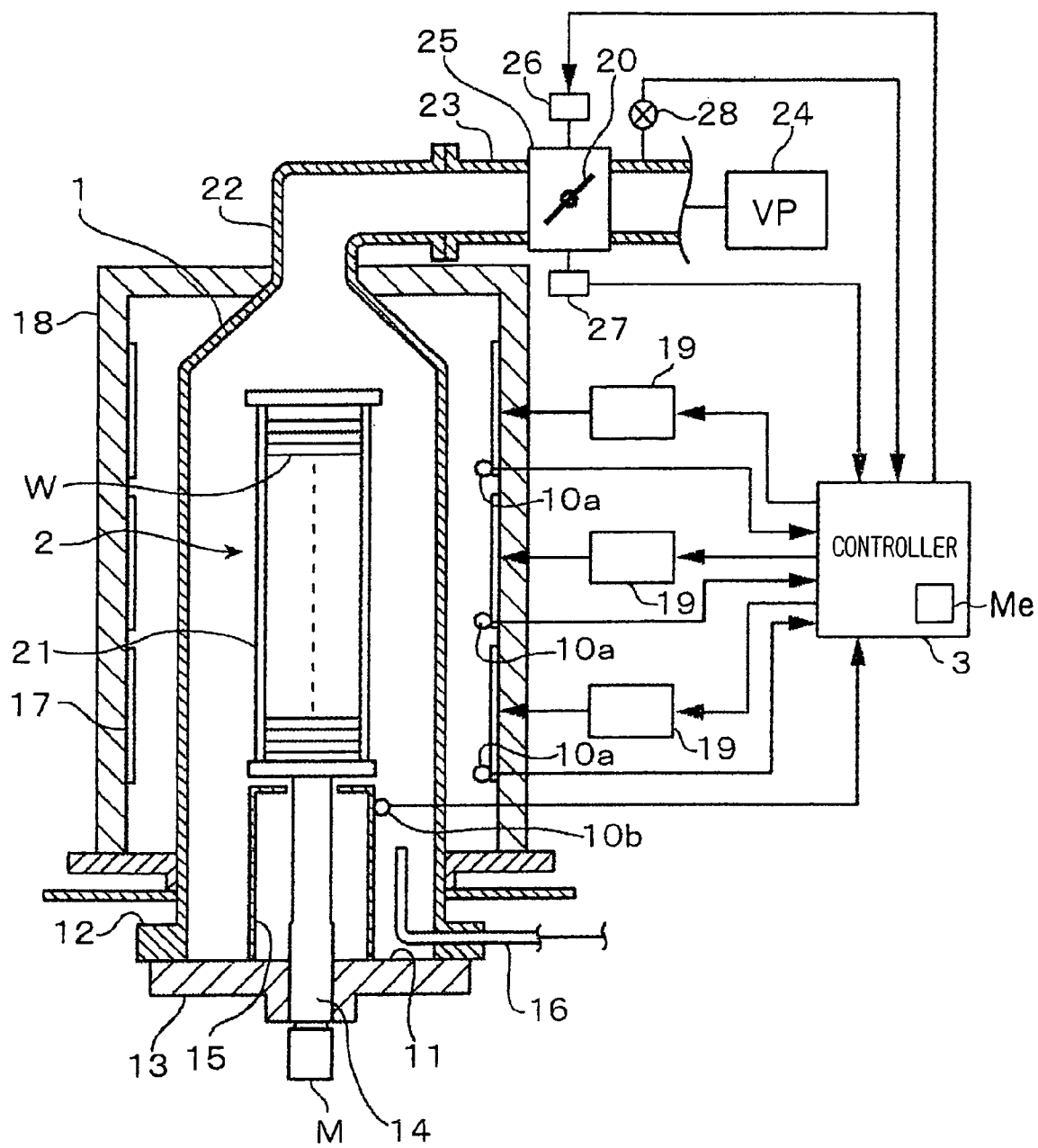
FIG. 1 is a partial sectional view showing schematically the overall configuration of a semiconductor manufacturing apparatus according to the present invention.

First, the overall configuration of a semiconductor manufacturing apparatus according to the present invention will be explained below referring to a vertical low-pressure CVD apparatus (deposition apparatus) which is a batch-type thermal processing apparatus as an example. In FIG. 1, a reference numeral 1 denotes a cylindrical vertical reaction vessel made of quartz. The bottom of the reaction vessel 1 is opened as a furnace throat. A flange 12 is formed around a lower end opening 11 of the reaction vessel 1. Provided at the bottom of the reaction vessel 1 is a lid 13 made of quartz, which is to be brought into contact with the underside of the flange 12 to air-tightly close the opening 11. The lid 13 is movable vertically by means of a boat elevator (elevating mechanism), not shown. A revolving shaft 14 penetrates through the center of the lid 13. A wafer boat 2 (substrate holder) is mounted on the top of the revolving shaft 14. The wafer boat 2 can be moved vertically between the inside of the reaction vessel 1 and a loading area (an area where wafers are loaded and unloaded) below the reaction vessel 1 by means of the boat elevator.

The wafer boat 2 includes three or more (e.g., four) column supports 21. A plurality of grooves (slots) are formed in each of the column supports 21 allowing the wafer boat 2 to support a plurality of (e.g., 100) wafers W (substrates to be processed) in a shelf-like manner. When a deposition process is performed, dummy wafers are held at top and bottom parts, i.e., dummy regions (refer to FIG. 6) of the wafer boat 2, and product wafers are held at an intermediate region between the two dummy regions. A motor M which rotates the wafer boat 2 connected to the revolving shaft 14 is connected to the bottom of the revolving shaft 14. A thermal insulating unit 15 is provided on the lid 13 so as to surround the revolving shaft 21.

An L-shaped injector 16 (gas supply part) for supplying gas to wafers W in the reaction vessel 1 is inserted into the flange 12 of the reaction vessel 1. Devices, such as a deposition gas supply source and a gas flow rate regulator, are connected to the proximal end of the injector 16 through a gas supply path.

An exhaust port 22 for evacuating the reaction vessel 1 is formed at the top of the reaction vessel 1. One end of an exhaust pipe 23 (vacuum exhaust path) is connected to the exhaust port 22. A vacuum pump (VP) 24 is connected to the other end of the exhaust pipe 23. A pressure control valve 25 (pressure control device) for controlling the internal pressure of the reaction vessel 1 is provided near the exhaust port 22 of the exhaust pipe 23. The pressure control valve 25 is composed of, for example, a butterfly valve. The pressure control valve 25 is provided with a driver 26 for controlling the opening of a valve element 20 and an angle detector 27 for detecting an angle of the valve element 20. A pressure sensor 28 is provided in the exhaust pipe 23. The internal pressure of the exhaust pipe 23 where the pressure sensor 28 is installed corresponds to the internal pressure of the reaction vessel 1. Thus, the internal pressure of the reaction vessel 1 can be monitored by the pressure sensor 28. Since the opening of the butterfly valve corresponds to the angle of valve element 20, the present specification uses the angle of the valve element 20 (referred to as "valve angle") as a parameter for indicating the opening of the butterfly valve.

A reference numeral 3 in FIG. 1 denotes a controller including a computer. The controller 3 is provided with a function to control the operation of the entire deposition apparatus according to a process recipe. For example, the controller 3 is provided with a function to conform the internal pressure of the reaction vessel 1 to a predetermined process pressure specified by the process recipe, for example, by performing feedback control of the driver 26 of the pressure control valve 25 based on a pressure detection value of the pressure sensor 28.

A heating furnace 18 having one or more heaters 17 (heating means) each composed of a resistance heating element for heating the inside of the reaction vessel 1 is provided around the reaction vessel 1. The heater 17 may be composed of a resistance heating element made of a conventional alloy, or a carbon wire having excellent temperature raising and lowering characteristics free from contamination. With the example shown in FIG. 1, the reaction vessel 1 is vertically divided into a plurality of (e.g., three) temperature control zones each being provided with one heater 17. A power controller 19 corresponding to each heater 17 supplies electric power to each heater 17, and the heat release value of each heater 17 is controlled independently. Temperature sensors (external temperature sensors) 10a each composed of, for example, thermocouple are provided at predetermined positions outside the reaction vessel 1, e.g., near respective heaters 17 in the illustrated embodiment. Furthermore, a temperature sensor (external temperature sensor) 10b composed of, for example, a thermocouple is provided at a predetermined position inside the reaction vessel 1, e.g., on the heat insulating unit 15 in the illustrated embodiment. Detection values of external and internal temperatures by these temperature sensors 10a and 10b are retrieved by the controller 3 and used to calculate command values for power control of the heaters 17. The foregoing overall configuration of the apparatus is common to various embodiments which will be described below; only the configurations of the controllers in respective embodiments are different from each other.

The present invention is characterized in the configuration and function of the controller 3, in particular, an abnormality monitoring or abnormality prediction function realized by the controller 3. The controller 3 will be explained below with reference to FIG. 2.

Figure 2:
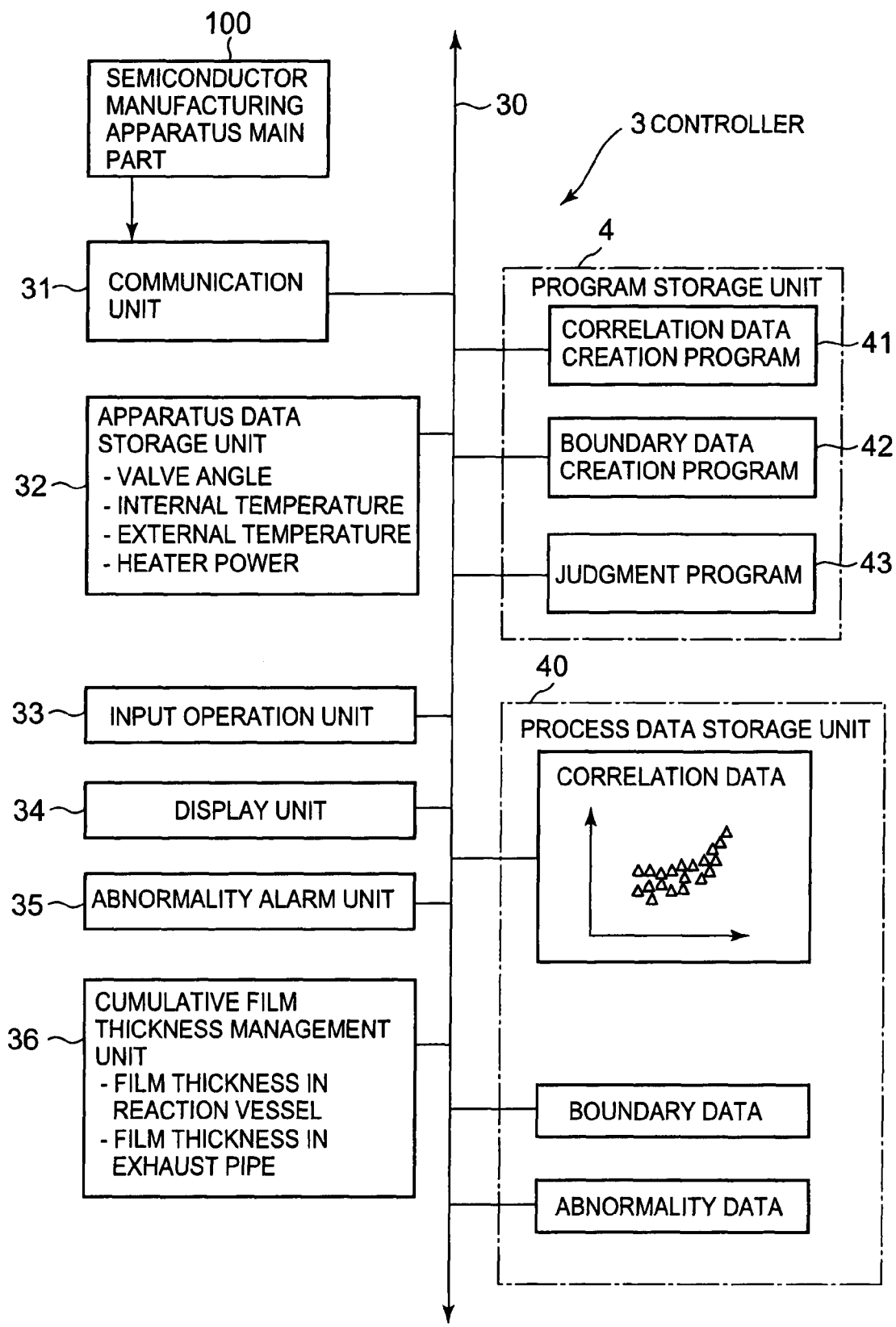
FIG. 2 is a block diagram showing the configuration of a controller in a first embodiment of the present invention.

A main part 100 of semiconductor manufacturing apparatus shown in FIG. 2 corresponds to a remaining part excluding the controller 3 in the deposition apparatus shown in FIG. 1. In other words, the main part 100 of semiconductor manufacturing apparatus corresponds to the whole part controlled by the controller 3 and a part that transmits a detected signal and data to the controller 3. In FIG. 2 showing a block diagram of the controller 3, a reference numeral 30 denotes a bus to which a communication unit, a storage unit, a program storage unit, a CPU, etc. are connected. The communication unit 31 communicates with the main part 100 of semiconductor manufacturing apparatus. Apparatus data, such as an angle of the pressure control valve 25 sent from the angle detector 27 and temperature detection values sent from temperature sensors 10a and 10b are retrieved by the controller 3 through the communication unit 31. Furthermore, control signals are transmitted from the controller 3 to the driver 26 of the pressure control valve 25, the power controllers 19 of the heaters 17, etc. through the communication unit 31.

Apparatus data are stored in the apparatus data storage unit 32. "Apparatus data" refers to values of parameters representing statuses of the main part 100 of semiconductor manufacturing apparatus. Such parameters include the angle of the valve 20, the internal and external temperatures, and the supply power to the heater 17, which are obtained through the communication unit 31. The supply power to the heater 17 stored in the apparatus data storage unit 32 may be a power command value transmitted from the controller 31 to the heater 17 or a power detection value detected by a wattmeter (not shown) located on a power supply line to the heater 17.

An input operation unit 33 inputs commands for the controller 3, for example, commands for creating correlation data or commands for creating boundary data, which are described later. The input operation unit 33 includes a keyboard, a mouse, and soft switches displayed on a display unit 34, such as a liquid crystal display, a CRT display, etc. The abnormality alarm unit (abnormality alarming means) 35 includes an alarming light, an alarm sound output part and a program for displaying abnormality alarm on the display for notifying an operator of an abnormality if the abnormality occurs in a semiconductor manufacturing apparatus or if occurrence of the abnormality is predicted.

The cumulative film thickness management unit 36 calculates and stores a sum total of target film thicknesses in deposition processes that have previously been performed based on a process recipe (omitted in FIG. 2) of deposition processes that have previously been performed. "Cumulative film thickness" managed by the cumulative film thickness management unit 36 includes the two different thicknesses. One is a sum total of target film thicknesses in deposition processes that have previously been performed from a point of time when a new reaction vessel 1 was started to being used or a point of time when the inside of the reaction vessel 1 was cleaned to remove adhered matters from the wall surface thereof; that corresponds to the film thickness of accretions adhering to the wall surface of the reaction vessel 1. The other is a sum total of target film thicknesses in deposition processes that have previously been performed from a point of time when a new exhaust pipe 23 was started to being used or a point of time when the inside of the exhaust pipe 23 was cleaned to remove adhered matters from the wall surface thereof. This sum total is not equal to the film thickness of adhered matters (reaction products) adhering to the wall surface of the exhaust pipe 23, but is almost proportional to it. Therefore, the sum total of target film thicknesses can be used as an index for evaluation of the cumulative film thickness of the exhaust pipe 23 in performing apparatus abnormality detection or abnormality prediction according to the present invention.

The program storage unit 4 includes a correlation data creation program 41, a boundary data creation program 42, and a judgment program (judgment means) 43 (also referred to as "abnormality detection program").

"Correlation data" is data showing a relation between at least two (in the illustrated embodiment, two) monitoring parameters selected from the aforementioned apparatus data (apparatus status parameters). The selected monitoring parameters have such a relationship that, when one of them changes, the other also changes accordingly. When creating correlation data, a biaxial coordinate system having a first axis assigned a first monitoring parameter and a second axis assigned a second monitoring parameter which affects the first monitoring parameter is used. A plurality of pieces of data consisting of a combination of first and second monitoring parameter values are plotted on the biaxial coordinate system.

Examples of a combination of first and second monitoring parameters are shown below.
  (Angle of the valve element 20 of the pressure control valve 25, Cumulative film thickness)
  (External temperature, Supply power to the heater 17)
  (Supply power to the heater 17, Cumulative film thickness)
  (External temperature, Internal temperature)

For example, when the first and second monitoring parameters are an angle of the valve element 20 of the pressure control valve 25 (hereinafter referred to as "valve angle") and a cumulative film thickness, respectively, monitoring means for these parameters are the angle detector 27 and the cumulative film thickness management unit 36. Furthermore, for example, when the first and second monitoring parameters are external temperature and supply power to the heater 17 (hereinafter referred to as "heater power"), respectively, monitoring means for these parameters are a temperature detector 30a and a wattmeter (not shown) (or a power command value calculation program in the controller 3). As clarified above, "monitoring means" for monitoring parameters includes both means for directly measuring a value of the monitoring parameter and means for obtaining a value of the monitoring parameter indirectly or through arithmetic processing.

Values of monitoring parameters are retrieved from the main part 100 of semiconductor manufacturing apparatus to the apparatus data storage unit 32 at intervals of, for example, one second through the communication unit 31. When a monitoring parameter corresponds to a command value transmitted from the controller 3 to the main part 100 of semiconductor manufacturing apparatus, the value of the monitoring parameter is transmitted to the apparatus data storage unit 32 through data transmission in the controller 3. Thus, monitoring parameter values are constantly stored in the apparatus data storage unit 32 while deposition process of wafers W is being performed.

Furthermore, an "evaluation value" for a monitoring parameter is created based on raw data (each individual value) of the monitoring parameter. For example, the "evaluation value" may be an average, for example a moving average, of a plurality of pieces of raw data of monitoring parameter values obtained within a predetermined period. When creating an "evaluation value", the standard deviation of a plurality of pieces of raw data can also be taken into consideration. At the time of abnormality judgment which will be explained in detail later, the evaluation value created based on a plurality of pieces of raw data is suitably used as a "monitoring parameter value" instead of each individual piece of raw data. This prevents excessively sensitive judgment, allowing stable judgment to be performed certainly. However, raw data of a monitoring parameter value may be used as a criterion for abnormality judgment. Also when creating correlation data (described later), the "evaluation value" may be used. Creation of an evaluation value can be performed by an evaluation value calculation program (not shown) stored in the apparatus data storage unit 32.

The correlation data creation program (correlation data creation means) 41 creates data (correlation data) which indicates a correlation between monitoring parameters, as mentioned above. In the illustrated embodiment, the correlation data creation program 41 creates correlation data which indicates a correlation between first and second monitoring parameter values in each RUN (a RUN means single execution of deposition process). In this example, the above-mentioned evaluation value is used as a monitoring parameter value. Here, a cumulative film thickness is selected as a first monitoring parameter, and a valve angle (an angle of the valve element 20 of the pressure control valve) as a second monitoring parameter. The correlation data creation program 41 plots data consisting of a combination of the value of the cumulative film thickness and the evaluation value of the valve angle in each RUN on an X-Y coordinate system (biaxial coordinate system) wherein the value of the cumulative film thickness is assigned to the X axis and the evaluation value of the valve angle (for example, an average is used as an evaluation value) to the Y axis. For example, a combination of the cumulative film thickness at the end of 9th RUN and the valve angle in 10th RUN can be used as a combination of the cumulative film thickness and the valve angle corresponding to 10th RUN. Here, the number of RUNs means the number of deposition processes that have previously been performed from a point of time when a new exhaust pipe 23 was installed or when the exhaust pipe 23 was cleaned. Correlation data can be created based on time series data of first and second monitoring parameters stored in the apparatus data storage unit 32.

FIG. 3(a) shows correlation data between the created cumulative film thickness and the valve angle created based on the above-mentioned procedures. Each individual plot on this graph is based on first and second monitoring parameter values sampled under the same set deposition pressure (process pressure determined by a deposition process recipe). This correlation data demonstrates that the valve angle increases with increasing cumulative film thickness and that, when the cumulative film thickness exceeds a certain value, the rate of increase in valve angle with respect to the increase in cumulative film thickness rapidly increases. This is because the conductance decreases with increasing film thickness of deposit on the inner wall surface of the exhaust pipe 23, making it necessary to increase the valve angle in order to maintain the same internal pressure of the exhaust pipe 23, i.e., the reaction vessel 1.

Correlation data shown in FIG. 3(a) was created based on a combination of the first and second monitoring parameter values (cumulative film thickness and valve angle) obtained when the deposition apparatus has previously been normally operating. Therefore, if a combination of the cumulative film thickness and the valve angle obtained during actual operation of the deposition apparatus has been plotted on a position apart (normally upward) from the plot group shown in FIG. 3(a), it can be judged that a certain abnormality (in this case, excessive deposited film thickness) has occurred in the deposition apparatus.

The boundary data creation program (boundary data creation means), 42 is used to create a boundary between normal and abnormal regions based on the correlation data shown in FIG. 3(a). An upper-limit line L1 and a lower-limit line L2 are shown as such a boundary in FIG. 3(b). When a plot based on data during actual operation of the apparatus is above the line L1 or below the line L2, it is judged that an abnormality occurs. Furthermore, upper portions of the lines L1 and L2 are connected with a horizontal line. When a plot is above the horizontal line, even if it is between the lines L1 and L2, it is judged that an abnormality occurs. As regards a butterfly valve, when the rotational angle, i.e., valve angle of the valve element 20 is close to 90 degrees (fully open), precise pressure control is disabled. In this case, the exhaust pipe 23 needs to be cleaned. The horizontal line corresponds to a limit value of deposited film thickness at which cleaning is required. Thus, in the present embodiment, a situation where cleaning is required is deemed to be occurrence of an abnormality in the deposition apparatus. Therefore, a region surrounded by the lines L1 and L2 and the horizontal line is defined as a normal region, and the other region as an abnormal region.

An example of a method of setting a boundary will be explained below. First, as shown in FIG. 4, correlation data is displayed on the screen of the display unit 34 which acts also as the input operation unit 33. The operator selects an approximate expression which is assumed to be suitable for defining a boundary between data groups constituting correlation data. Coefficients (constants) in the selected approximate expression are calculated and boundary (control value) lines are created by an automatic coefficient calculation program built in the boundary data creation program 42. As an approximate expression, a 1st to 7th order function formula, a logarithmic function formula, an exponential function formula, and an ellipse formula (refer to left-hand side of FIG. 4) can be used, but not limited thereto. In FIG. 3(b), correlation data and boundary lines are simultaneously displayed. Correlation data and boundary data are stored in the process data storage unit 5. The above-mentioned correlation data may be obtained previously in the apparatus under management or in another apparatus having the same specifications as the apparatus under management. In this case, different correlation data will be created for different set pressures.

The judgment program 43 judges whether or not there exists an abnormality in the deposition apparatus based on monitoring parameter values relating to the present RUN (in this embodiment, the valve angle captured in the apparatus data storage unit 32 and the cumulative film thickness managed by the cumulative film thickness management unit 36). The judgment program 43 determines whether the plot of a combination of the valve angle and the cumulative film thickness relating to the present RUN is within the normal region shown in FIG. 3(b). The judgment program 43, when it judges that the plot is in the abnormal region, directs the abnormality alarm unit 35 to perform abnormality alarming, and also stores the abnormal data used as the basis for judgment in the process data storage unit 5.

The correlation data creation program 41 creates, in the same procedures as those mentioned above, not only data of correlation between the valve angle and the cumulative film thickness but also data of correlation between the external temperature (temperature measured by the temperature sensor 10a) and the heater power, data of correlation between the cumulative film thickness and the heater power, and other data of correlation between monitoring parameters having a correlation.

FIG. 5(a) shows data of correlation between the external temperature and the heater power. If the supply power to the heater 17 is changed, the external temperature also changes. Here, an ellipse formula is selected as an approximate expression which defines a boundary. FIG. 5(b) shows the correlation data in FIG. 5(a) together with boundary lines created through the boundary data creation program 42.

There is a correlation between the heater power and the cumulative film thickness. The supply power to the heater 17 is controlled taking into consideration the detection value of internal temperature (i.e., internal temperature of the reaction vessel) by the temperature sensor 10b. Here, the relation between the heat release value of the heater 17 and the internal temperature depends on the film thickness of a thin film adhering to the inner wall of the reaction vessel 1. Specifically, radiant heat from the heater 17 is interrupted by a thin film adhering to the inner wall surface of the reaction vessel 1. Therefore, if a cumulative film thickness increases, it becomes necessary to increase the heat release value of the heater 17 (increase the supply power to the heater 17) in order to maintain the inside of the reaction vessel 1 at the same temperature. Since there is a correlation between the heater power and the cumulative film thickness shown in FIG. 6(a), these parameters may be a combination of monitoring parameters having a correlation. In this case, a secondary function formula, for example, may be selected as an approximate expression that defines a boundary (boundary data). FIG. 6(b) shows the correlation data of FIG. 6(a) together with boundary lines. As previously mentioned, the inside of the reaction vessel 1 is divided into a plurality of temperature control zones, each being assigned a heater 17. In such a case, correlation data is created for each heater 17 (each zone).

Each of the above-mentioned programs 41 to 43 is stored in a removable storage medium (not shown), such as a flexible disk (FD), a compact disk (CD), a magnet optical disc (MO), etc.; installed in the computer which is the controller 3; and stored in the program storage unit 4. The program storage unit 4 is typically realized with a data storage area in a hard disk drive (HDD) which is a fixed storage medium Me (refer to FIG. 1) built in the computer. This also applies to each program concerning other embodiments which will be described later.

Then, the operation of the foregoing deposition apparatus will be described below. First, one process recipe is selected from a plurality of process recipes stored in the process recipe storage unit (not shown) of the controller 3. The deposition apparatus operates as follows according to processing procedures and process conditions defined by the selected process recipe.

First, a predetermined number of wafers W which are substrates for fabricating semiconductor devices, such as semiconductor integrated circuits, are held on a wafer boat 4 in a shelf-like manner by means of a transfer arm (not shown). By raising a boat elevator (not shown), the wafer boat 4 is loaded into the reaction vessel 1 and at the same time the bottom opening 11 of the reaction vessel 1 is closed by the lid 13. Then, the inside of the reaction vessel 1 is heated and stabilized at a predetermined process temperature.

After the inside of the reaction vessel 1 is fully evacuated while the pressure control valve 25 is fully opened, a process gas is supplied from an injector 16 into the reaction vessel 1 at a predetermined flow rate, and at the same time the opening, i.e., valve angle, of the pressure control valve 25 is controlled so that the internal pressure of the reaction vessel 1 coincides with a predetermined process pressure. The controller 3 compares a pressure detection value of the pressure sensor 28 provided in the exhaust pipe 23 with a set pressure described in the process recipe, and transmits a control signal to a valve actuator of the pressure control valve 25, i.e., the driver 26 to control the angle of the valve 20, thereby performing control so that the pressure detection value conforms to the set pressure.

Furthermore, the controller 3 retrieves a temperature detection value of the temperature sensors 10a and 10b, and outputs power command values (control signals) to the power controllers 19 based on the temperature detection value and the set temperature described in the recipe to perform such control that the atmospheric temperature in the reaction vessel 1, i.e., process temperature coincides with the set temperature.

Thus, deposition process of wafers W is performed while a predetermined heated and evacuated atmosphere is maintained in the inside of the reaction vessel 1. Thereafter, the inside of the reaction vessel 1 is replaced with a purge gas and then the wafer boat 2 is unloaded from the reaction vessel 1. This completes a series of process steps.

Figure 3:
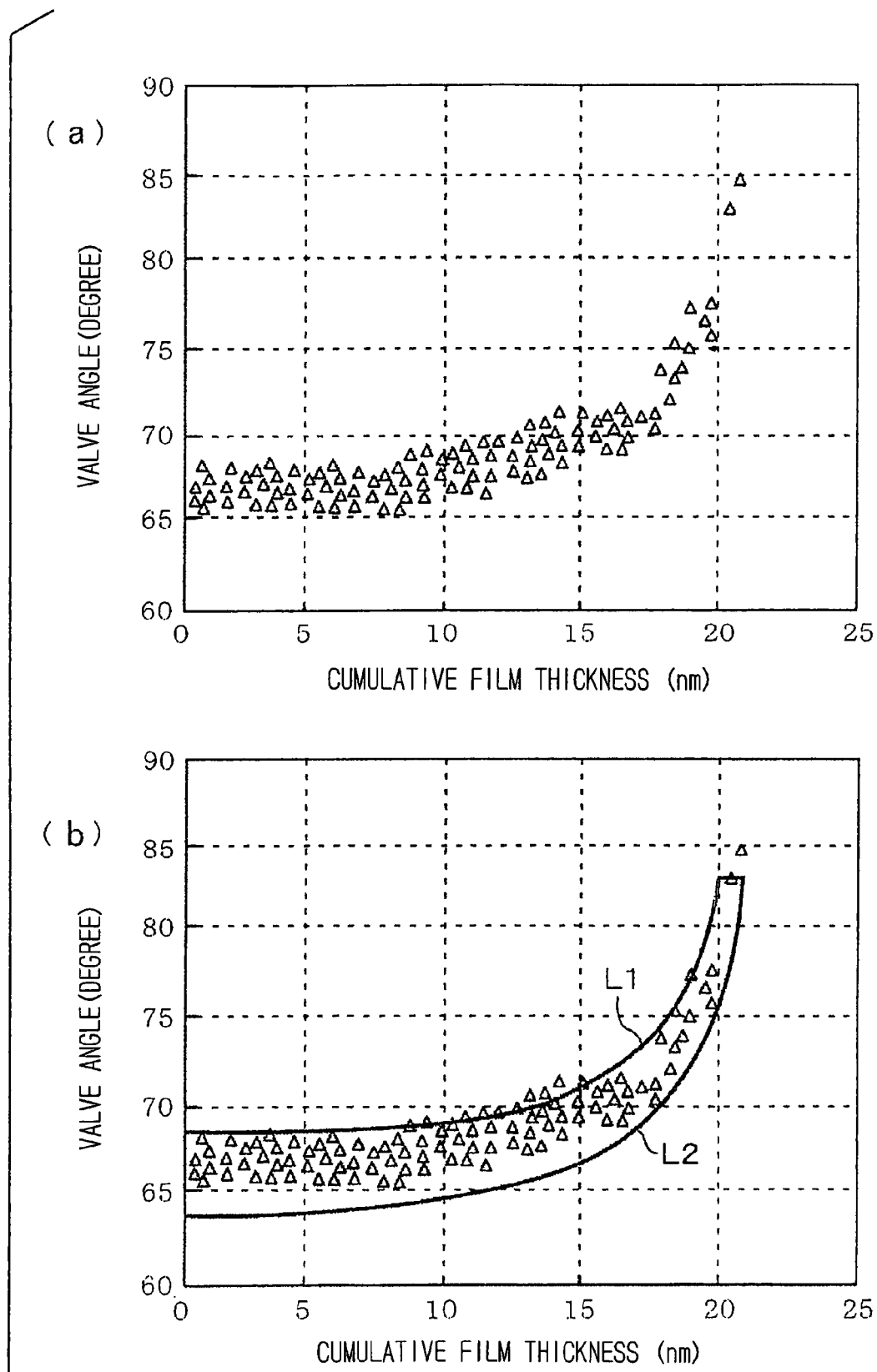
FIG. 3 is a graph showing an example of correlation data and boundary data.
Figure 4:
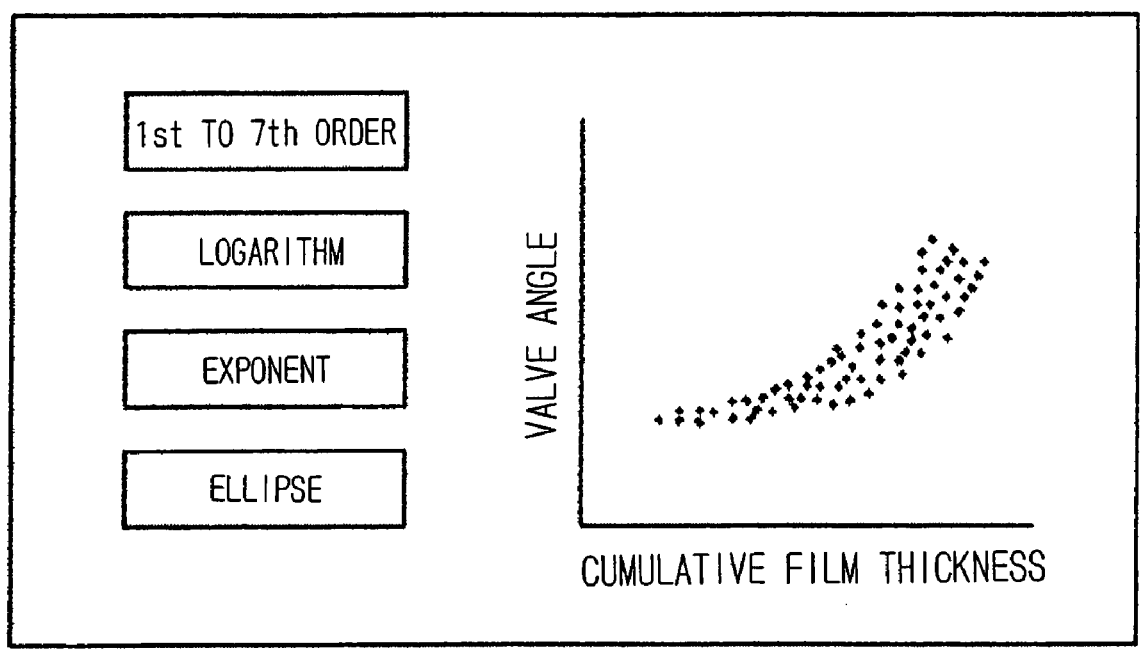
FIG. 4 is a diagram showing display of a display unit when creating boundary data.
Figure 5:
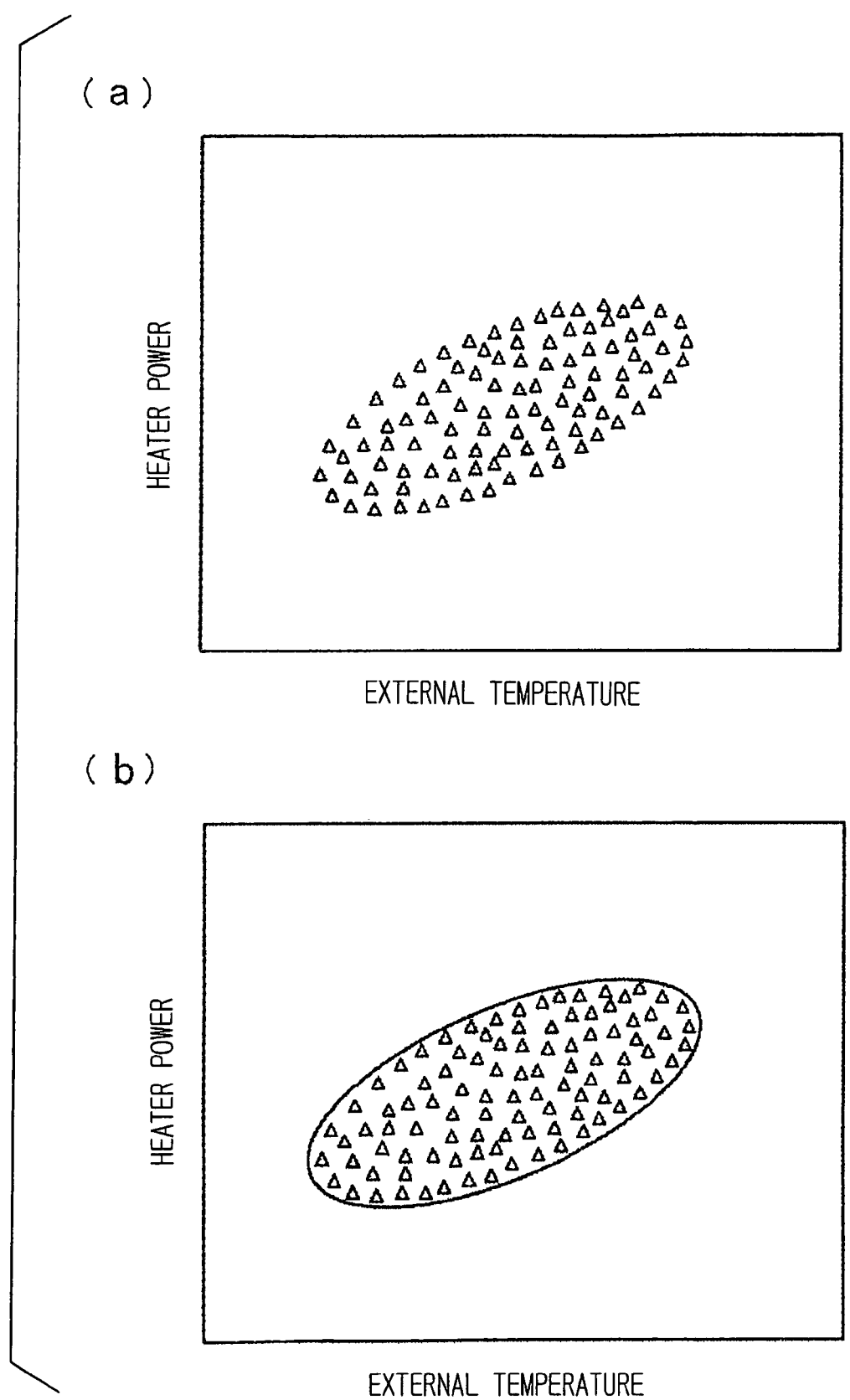
FIG. 5 is a graph showing another example of correlation data and boundary data.
Figure 6:
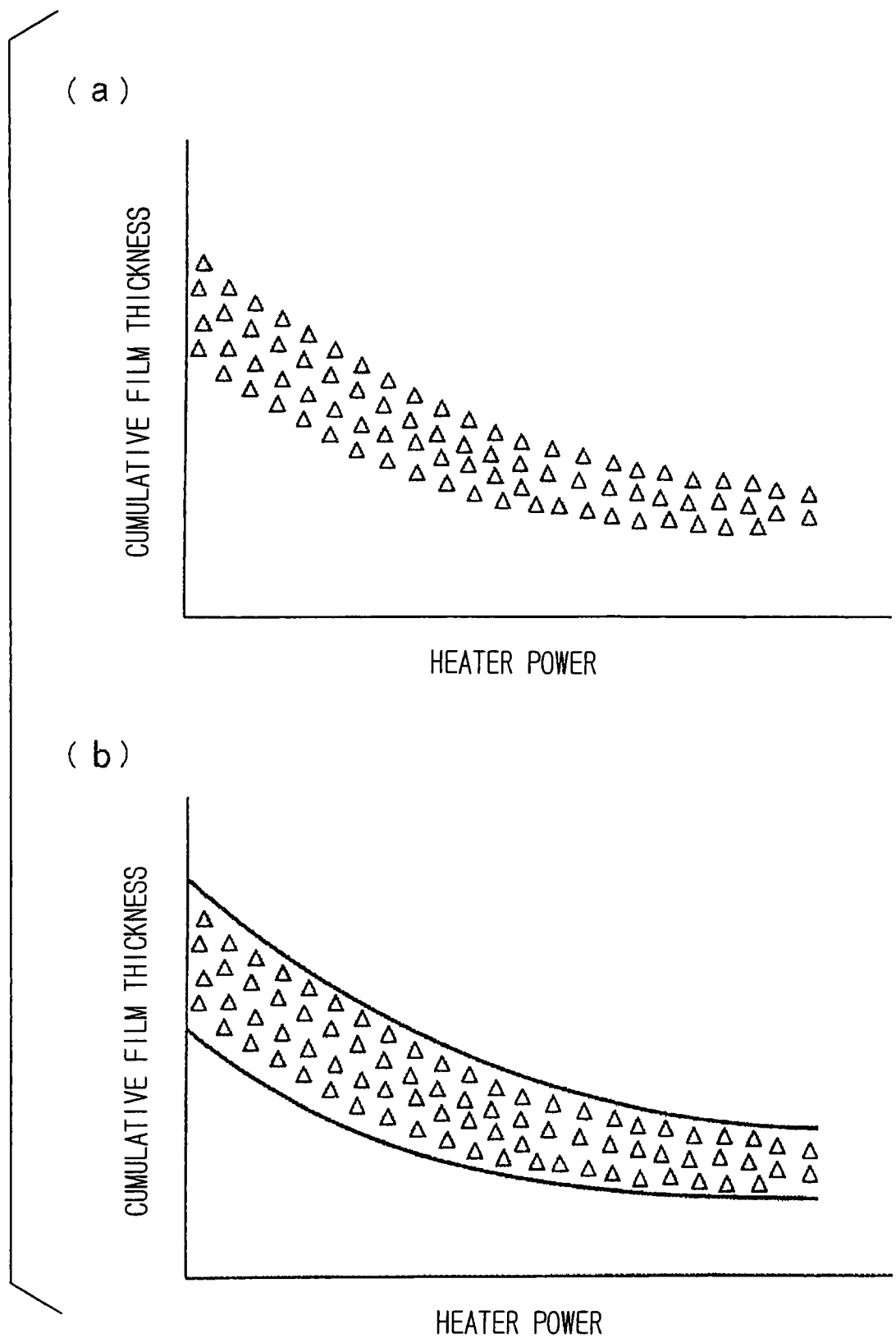
FIG. 6 is a graph showing still another example of correlation data and boundary data.

As previously described, correlation data and boundary data are stored in the process data storage unit 40, as shown in FIGS. 3, 5, and 6. The judgment program 41 compares the value of a monitoring parameter selected from the apparatus data (apparatus status parameters) loaded into the apparatus data storage unit 32 with the boundary data relating to the monitoring parameter to determine whether or not there exists an abnormality in the apparatus. For example, a moving average (an evaluation value of monitoring parameter) is obtained based on values of the valve angle (detection values of angle from the angle detector 27) constantly loaded into the apparatus data storage unit 32 from the main part 100 of the apparatus. Furthermore, values of cumulative film thickness for up to a RUN immediately before a RUN currently being performed are read out, which are managed by the cumulative film thickness management unit 36. The coordinate position of a plot of a combination of the moving average of the valve angle and the value of cumulative film thickness on the graph of FIG. 3(*b*) is obtained to determine whether the position is within the normal region, i.e., between the top boundary line L1 and the bottom boundary line L2. As previously described, since correlation data is created for each set pressure (process pressure defined by the process recipe), boundary data for correlation data corresponding to the set pressure of deposition process to be performed is used.

If the judgment program 41 judges that the foregoing coordinate position is located within the abnormal region, the abnormality alarm unit 35 generates a warning. In this case, it is possible that the airtightness of the reaction vessel 1 is not sufficient and the outside air has entered the reaction vessel 1, and therefore countermeasures such as inspection of sealed parts are taken. Furthermore, when the foregoing coordinate position is located above the horizontal line connecting two boundary lines L1 and L2 even if it is between the top and bottom boundary lines L1 and L2, a warning is generated alarming that cleaning time has come.

Furthermore, whether or not there exists an abnormality relating to other correlation data is also judged according to the same procedures as those mentioned above. For example, in connection with external temperature and heater power loaded into the apparatus data storage unit 32, a coordinate position of a combination of these evaluation values (for example, moving average of these monitoring parameter values) on the graph of FIG. 5(*b*) is obtained to judge whether the position is located within a boundary line (in this example, an ellipse). If the position is located out of the boundary line, the abnormality alarm unit 35 generates a warning. A possible reason why the foregoing coordinate position is located out of the ellipse is, for example, that remarkably high electric power is required to obtain a certain heat release value since the heater 17 comes near the end of its life. It is possible to judge whether or not there exists an abnormality of the heater 17 based on single correlation data between the external temperature and the heater power, for deposition processes using different set temperatures (process temperatures defined by the process recipe).

Furthermore, as regards the cumulative film thickness and the heater power, a judgment is also made according to the same procedures as those mentioned above. If it is judged that an abnormality occurs, a warning is generated. In connection with this combination of monitoring parameters, correlation data is prepared for each set temperature, and boundary data regarding the correlation data corresponding to the set temperature of deposition process performed is used. A possible cause of abnormality is that the heater 17 comes near the end of its life.

In accordance with the foregoing embodiment, normal or abnormal is determined based on the value of a first monitoring parameter and the value of a second monitoring parameter which affects the magnitude of the value of the first monitoring parameter, making it possible to certainly detect an abnormality of semiconductor manufacturing apparatus. Furthermore, leakage of the reaction vessel 1 can certainly be detected with the use of the correlation data between the valve angle and the cumulative film thickness. Furthermore, it is possible to distinguish between the degradation of airtightness of the reaction vessel 1 and the coming of the time for cleaning. Therefore, deposition process can be performed until immediately before the film thickness of adhered matters on the inner wall surface of the exhaust pipe 23 has increased to an extent that cleaning is required. Accordingly, it is possible to take a long maintenance cycle and suppress the down time of the apparatus.

Furthermore, an abnormality of the heater 17 can certainly be detected with the use of the correlation data between the heater power and the cumulative film thickness or the heater temperature. Furthermore, since the end of the operating life of the heater 17 can be grasped, the expensive heater 17 can be utilized until the end of its life, allowing reduction of the running cost of the apparatus. Furthermore, in comparison with a conventional case where the heater 17 is replaced at certain intervals of operation, it is possible to take a longer maintenance cycle and suppress the down time of the apparatus.

Second Embodiment

A second embodiment will be described below with reference to FIGS. 7 to 10. Each embodiment described below in the present specification differs from the first embodiment mainly in the configuration and function of the controller, but the configuration of the main part 100 of semiconductor manufacturing apparatus is the same.

In the second embodiment, the vertical low-pressure CVD apparatus is configured so that the batch size (the number of wafers or substrates which can collectively be processed) can be selected. Specifically, it is possible to collectively process not only the maximum number of wafers W which can be loaded on the wafer boat 21 but also less number of wafers. The difference in the function is realized by modifying the controller 3 without modifying the configuration of the main part 100 of semiconductor manufacturing apparatus.

Figure 7:
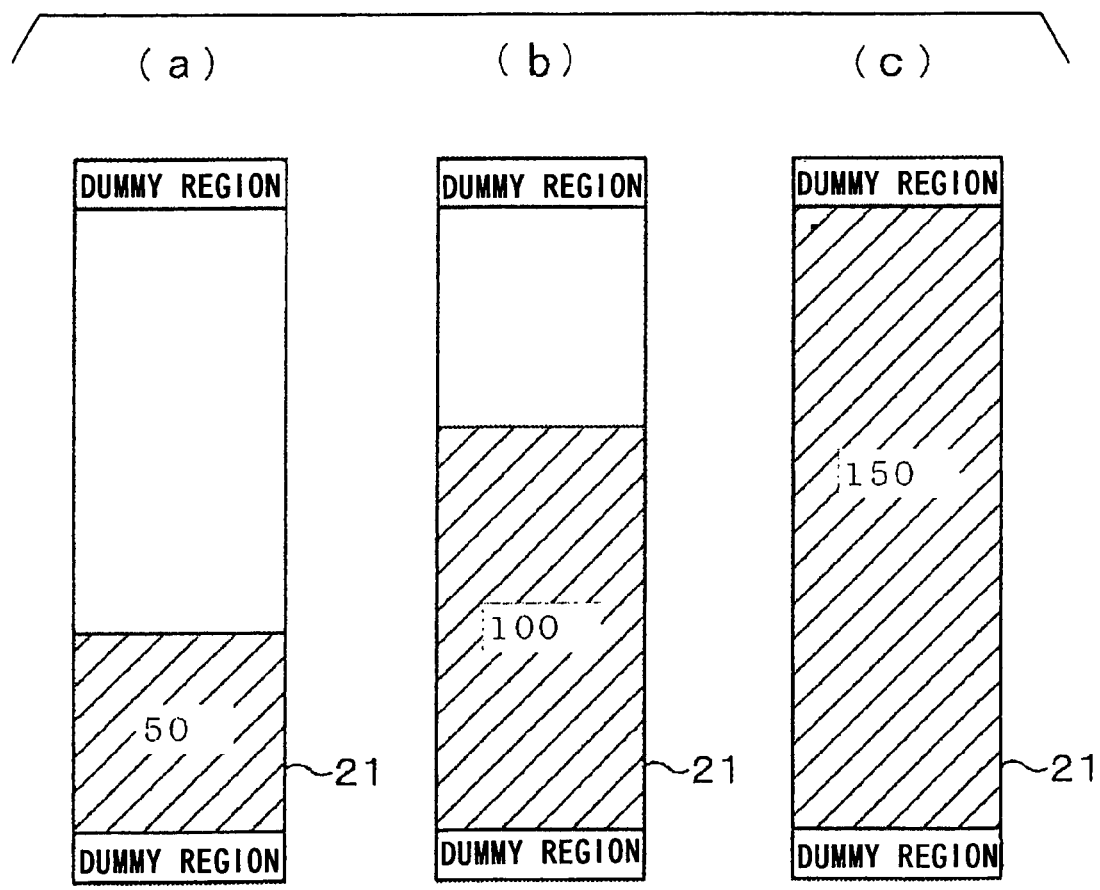
FIG. 7 is a diagram showing wafer loaded on a wafer boat for each of different batch sizes.

The deposition apparatus according to the second embodiment can treat wafers W in three different batch sizes. FIG. 7 schematically shows an example of the relationship between the number of wafers W which are to be collectively processed (i.e., batch size) and wafer W holding regions in the wafer boat 21. Dummy wafers are held in the top and bottom slots (dummy wafer regions) of the wafer boat 21 regardless of the batch size. Product wafers are held in slots (product wafer region) between the two dummy wafer regions. When the batch size is 50 and 100, product wafers are held in lower slots of the product wafer region of the wafer boat 21, and slots thereabove are empty. When the batch size is 150, the wafer boat 21 is fully loaded with wafers W.

Figure 8:
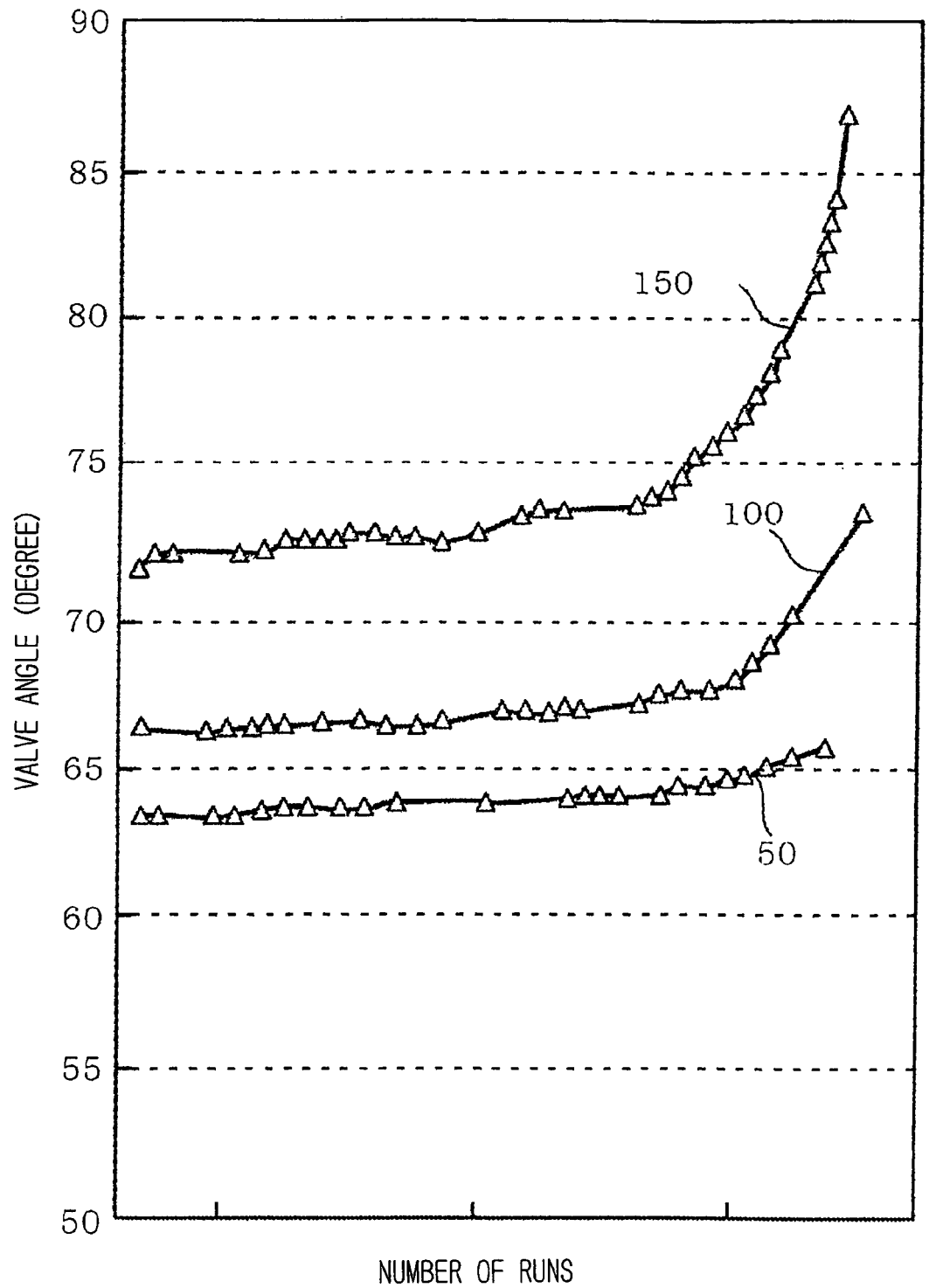
FIG. 8 is a graph showing a relation between the number of deposition processes and valve angle for each of different batch sizes.

FIG. 8 is a graph showing the change in the valve angle (in this example, an average of the valve angles during one deposition process) in deposition processes with the increment of the number of RUNs when the deposition process is sequentially repeated with each of batch sizes 50, 100, and 150. In this case, as the batch size increases, the valve angle increases accordingly, shifting data plots more upward.

FIG. 9 shows correlation data between the cumulative film thickness and the valve opening for each of different batch sizes, which are created based on the data shown in FIG. 8. Incidentally, with an increase in the number of data items, for each of different batch sizes, plot groups are distributed in a region having a width as shown in FIG. 3. In FIG. 9, typical plots are extracted from plot groups and the extracted plots are connected with a line to make the graph simple. As clarified in FIG. 9, as the batch size changes, the correlation data between the cumulative film thickness and the valve angle changes accordingly. Main reason is that the volume of the interior space of the reaction vessel 1 depends on the batch size. Therefore, the boundary between the normal and abnormal regions also depends on the batch size.

Figure 10:
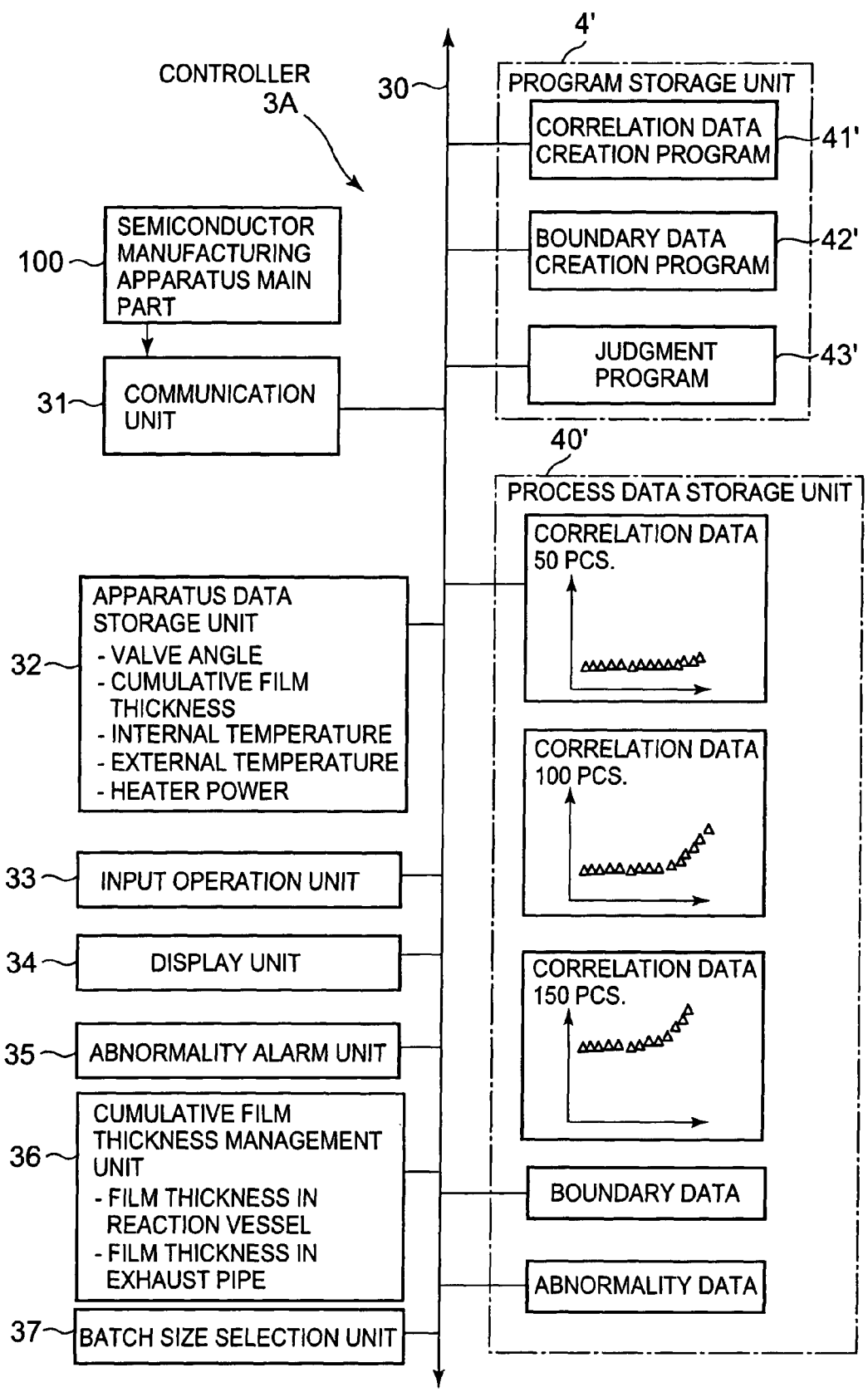
FIG. 10 is a block diagram showing the configuration of a controller in a second embodiment of the present invention.

A controller 3A in the second embodiment differs from the controller 3 in the first embodiment mainly in the following respects. As shown in FIG. 10, the controller 3A includes a batch size selection unit 37 for selecting the batch size. This batch size selection unit 37 includes soft switches configured so that the batch size is selected from 50, 100, and 150 on the screen of the display unit 34. When a batch size is selected, the controller 3A issues a command to a transfer arm disposed in a transfer chamber (not shown) to transfer wafers W whose number is determined by the batch size to the wafer boat 2. Then, the deposition apparatus performs deposition process on wafers W according to the same procedures as those previously described in connection with the first embodiment.

A correlation data creation program 41' is configured so as to create correlation data as shown in FIG. 9 for each of different batch sizes based on the data shown in FIG. 8. The created correlation data is stored in the process data storage unit 32. A boundary data creation program 42' is configured so as to create boundary data that defines a boundary between the normal and abnormal regions based on the correlation data (actually having a width as shown in FIG. 3) for each of different batch sizes shown in FIG. 9. The boundary data creation program 42' creates boundary lines with the same procedure as that previously described in the description of the first embodiment.

A judgment program 43' functions in the same manner as the judgment program 43 of the first embodiment except that it makes judgment by using boundary data corresponding to a selected batch size. Specifically, the judgment program 43' judges whether or not there exists an abnormality by using boundary data corresponding to the batch size for each combination of the first and second monitoring parameters ((valve angle and cumulative film thickness), (external temperature and heater power), and (heater power and cumulative film thickness)) as a basis of judgment.

The second embodiment achieves an advantageous effect that precise abnormality detection can also be performed in an apparatus in which the batch size can be changed, in addition to the advantageous effects achieved by the first embodiment.

Third Embodiment

Next, a third embodiment will be described below with reference to FIGS. 11 to 18.

Figure 11:
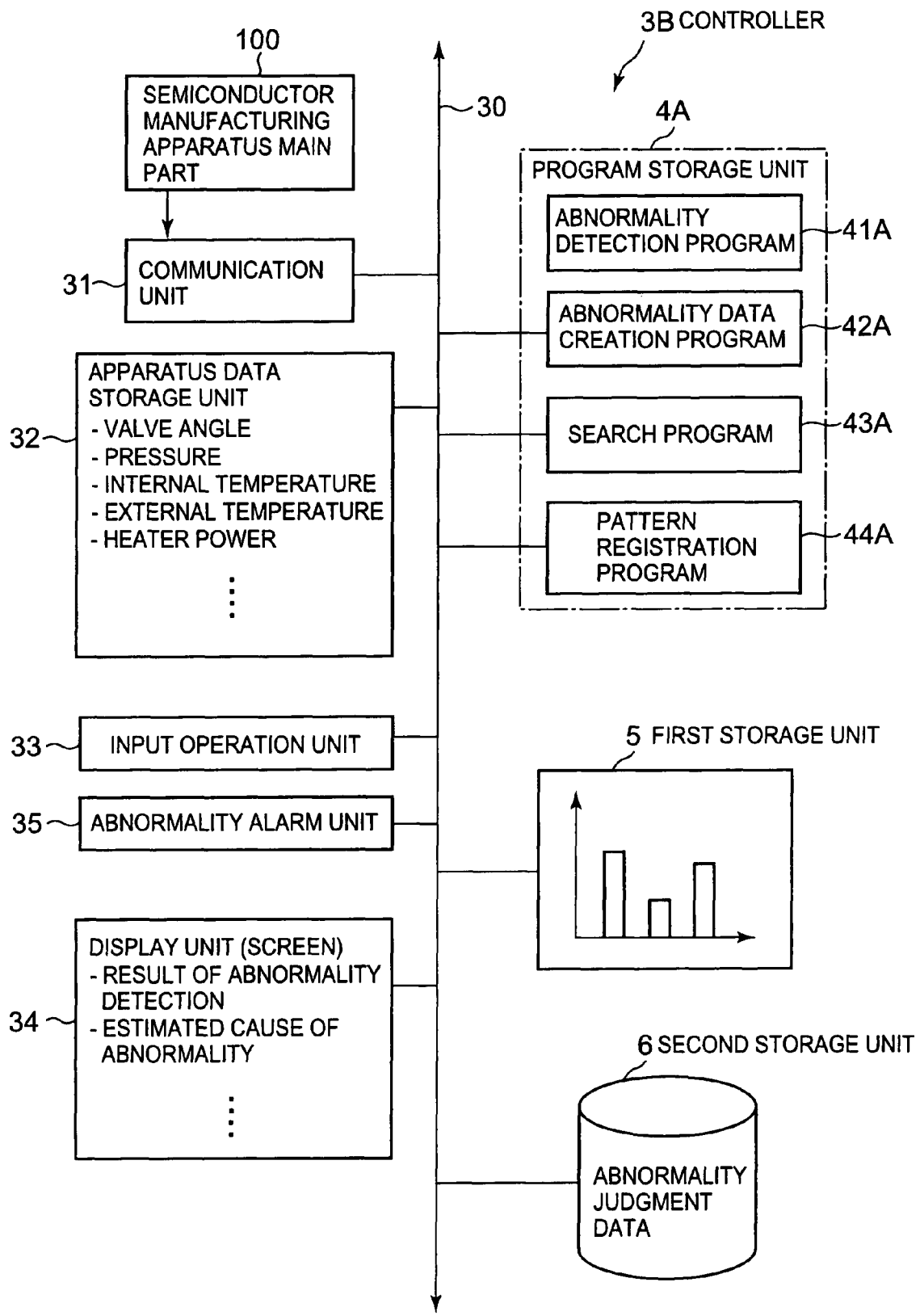
FIG. 11 is a block diagram showing a configuration of a controller in a third embodiment of the present invention.

First, a controller 3B in the third embodiment will be described below with reference to FIG. 11, focusing on the difference from the controller 3 in the first embodiment.

Although the input operation unit 33 in the third embodiment is provided with almost the same functions as the input operation unit 33 in the first embodiment, it also plays a role of inputting various commands, such as a data search (retrieval) command (described later) when an abnormality occurs.

A program storage unit 4A in the third embodiment includes an abnormality detection program 41A, an abnormality data creation program 42A, a search (cause estimation) program 43A, and a pattern registration program 44A.

The abnormality detection program (abnormality detection means) 41A detects an abnormality of apparatus based on values of monitoring parameters (for example, internal temperature and valve angle) selected from the apparatus data (apparatus status parameters) loaded into the apparatus data storage unit 32. The abnormality detection program 41A may also be configured so as to determine an abnormality of apparatus based on whether or not at least one of a plurality of detection values of monitoring parameters exceeds a threshold value.

Alternatively, the abnormality detection program 41A may be configured so as to judge occurrence of an abnormality based on data of a combination of monitoring parameters having a correlation (for example, a combination of monitoring parameters relating to temperature detection value, or a combination of parameters relating to pressure detection value) of a plurality of monitoring parameters. In this case, for example, a Mahalanobis distance (this is well known as a multivariate analysis method) between data groups of a combination of monitoring parameters that were obtained when the apparatus was in normal operation and data of a combination of monitoring parameters obtained when the apparatus is actually operated may be calculated; and if the Mahalanobis distance exceeds a predetermined control value (threshold value), it may be judged that there is an abnormality in the apparatus. Other known data analysis algorithms can also be applied.

The abnormality data creation program (abnormality data creation means) 42A is configured so that, if an abnormality is detected by the abnormality detection program 41A, the abnormality data creation program 42A standardizes each of detection values of at least two monitoring parameters relating to the abnormality and creates a combination of standardized detection values (referred to as "abnormality data") of the monitoring parameters. At least two monitoring parameters relating to the abnormality can be selected by the operator by means of the input operation unit 33. Thus, if an abnormality is detected, a monitoring parameter indicating an abnormal value or a combination of monitoring parameters indicating an abnormal value is displayed on the display unit 34, allowing the operator to select a combination of monitoring parameters including the monitoring parameter indicating the abnormal value before searching the cause of the abnormality.

For example, if a temperature-related abnormality is detected, a combination of the external temperature, the internal temperature, and the heater power is selected as a combination of monitoring parameters for creating an abnormality data. For example, if a pressure-related abnormality is detected, a combination of the pressure detection value (detected by the pressure sensor 28), the valve angle, and the evacuation time (time necessary to evacuate the processing vessel from the atmospheric pressure to a preset degree of vacuum) is selected as a combination of monitoring parameters for creating an abnormality data. Note that, the evacuation time is monitored by an evacuation time monitoring program which is not shown in FIG. 11.

"The standardization of detection value of monitoring parameter" means the standardization of a detection value (or an average of a plurality of detection values) of monitoring parameters on the basis of a set value of the monitoring parameter or a value expected to be taken by the monitoring parameter. The simplest possible standardization formula is "Standardization value=(Detection value−Expected value)/ Expected value", but not limited thereto. An example of a combination of standardized detection values of monitoring parameters, i.e., abnormality data is shown at the top of the table of FIG. 16, where a combination [External temperature 54, Internal temperature 10, Heater power 11] corresponds to the abnormality data. These three values [54, 10, 11] are merely shown as an example for explanation.

The controller 3B in the third embodiment includes a first storage unit 5 and a second storage unit 6. Abnormality data created in the aforementioned manner by the abnormality data creation program 42A is stored in the first storage unit 5.

A number of pieces of abnormality judgment data are stored in the second storage unit 6. "Abnormality judgment data" is composed of a combination of "abnormality data", "abnormality status", "cause of abnormality", and "countermeasure against abnormality" obtained through abnormality analyses or experiments that have previously been performed. An example of abnormality judgment data is shown in FIG. 12.

Figure 12:
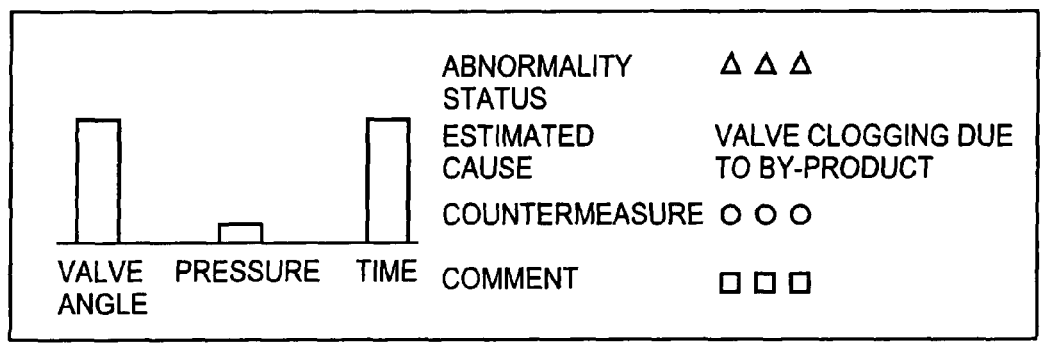
FIG. 12 is a diagram illustrating abnormality judgment data.
Figure 12:
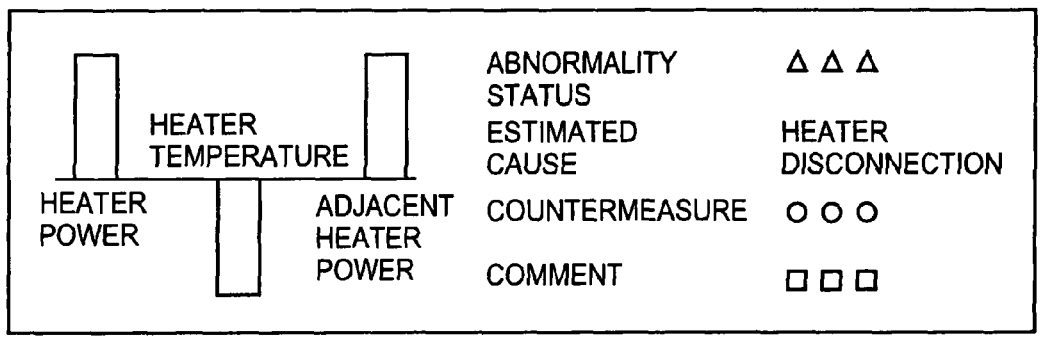
Figure 12:
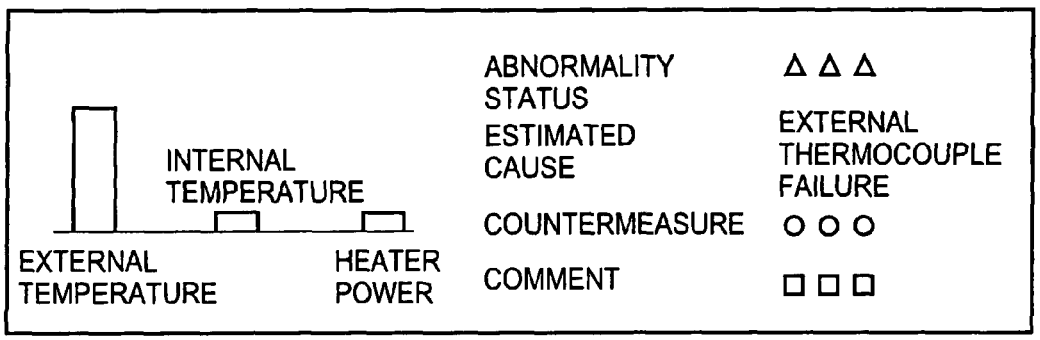

FIG. 12(*a*) shows abnormality judgment data regarding three monitoring parameters: valve angle, pressure detection value, and evacuation time. Abnormality data is shown on the left-hand side of FIG. 12(*a*). The value of each monitoring parameter constituting this abnormality data is a detection value of monitoring parameter, standardized by the above-mentioned method. (This also applies to examples shown in FIGS. 12(*b*) and 12(*c*).) As shown on the right-hand side of FIG. 12(*a*), abnormality judgment data includes failure condition, estimated cause of failure, solution for failure, and a comment corresponding to failure data. A data code for management is attached to the abnormality judgment data. In the example of FIG. 12 (*a*), the "failure condition" is "a long evacuation time" and the "estimated cause of failure" is "valve blockage caused by adhesion of reaction by-product to the inside of valve."

FIG. 12(*b*) shows abnormality judgment data regarding three different monitoring parameters: electric power (heater power) supplied to the heater 17 in charge of a certain temperature control zone (refer to the description of the first embodiment), temperature of the heater 17 (external temperature), and electric power (heater power) supplied to the heater 17 in a zone adjacent to the zone. In this example, the "abnormality status" is "low temperature of the heater 17" and the "estimated cause of abnormality" is "disconnection fault of heater element of the heater 17." As shown in FIG. 12(*b*), the standardized detection value may be a negative value.

FIG. 12(*c*) shows abnormality judgment data regarding three monitoring parameters: external temperature, internal temperature, and heater power. The external temperature and heater power correspond to the same zone. In this example, "abnormality status" is "high temperature (external temperature) of the heater 17" and "estimated cause of abnormality" is "failure of external temperature sensor 10*a* (thermocouple)."

A combination of standardized values of monitoring parameters constituting abnormality data is referred to as "abnormality data pattern." Different "failure data patterns" may appear to monitoring parameters of the same type, if causes of abnormality are different.

Referring to FIG. 11 again, the search program (searching means) 43A (also referred to as "cause estimation program") is configured so that, if an abnormality of the deposition apparatus is detected by the abnormality detection program 41A, the search program 43A checks whether or not there exists in the second storage unit 6 such abnormality judgment data that includes abnormality data (abnormality data pattern) coinciding with actual abnormality data regarding a combination of monitoring parameters selected by the operator and, if a coincident piece of abnormality judgment data is found, reads it out. "Coincidence of abnormality data (abnormality data patterns)" means that two pieces of abnormality data resemble each other to more than a predetermined degree. The degree of resemblance can be represented by a ratio of a smaller value of two values of a monitoring parameter constituting the abnormality data to a larger value of the two values.

The pattern registration program 44A executes a step of registering abnormality judgment data prior to operation of the deposition apparatus. If an abnormality occurs and there is no abnormality judgment data coinciding with the abnormality data in the second storage unit 6, the pattern registration program 44A further executes a step of attaching information, such as "cause of failure" and "countermeasure against abnormality", to the abnormality data and storing (registering) the abnormality data in the second storage unit 6.

Then, the operation of the semiconductor manufacturing apparatus in the third embodiment will be described below. The deposition process itself performed by the semiconductor manufacturing apparatus is the same as that in the first embodiment, and thus duplicated description will be omitted.

Figure 13:
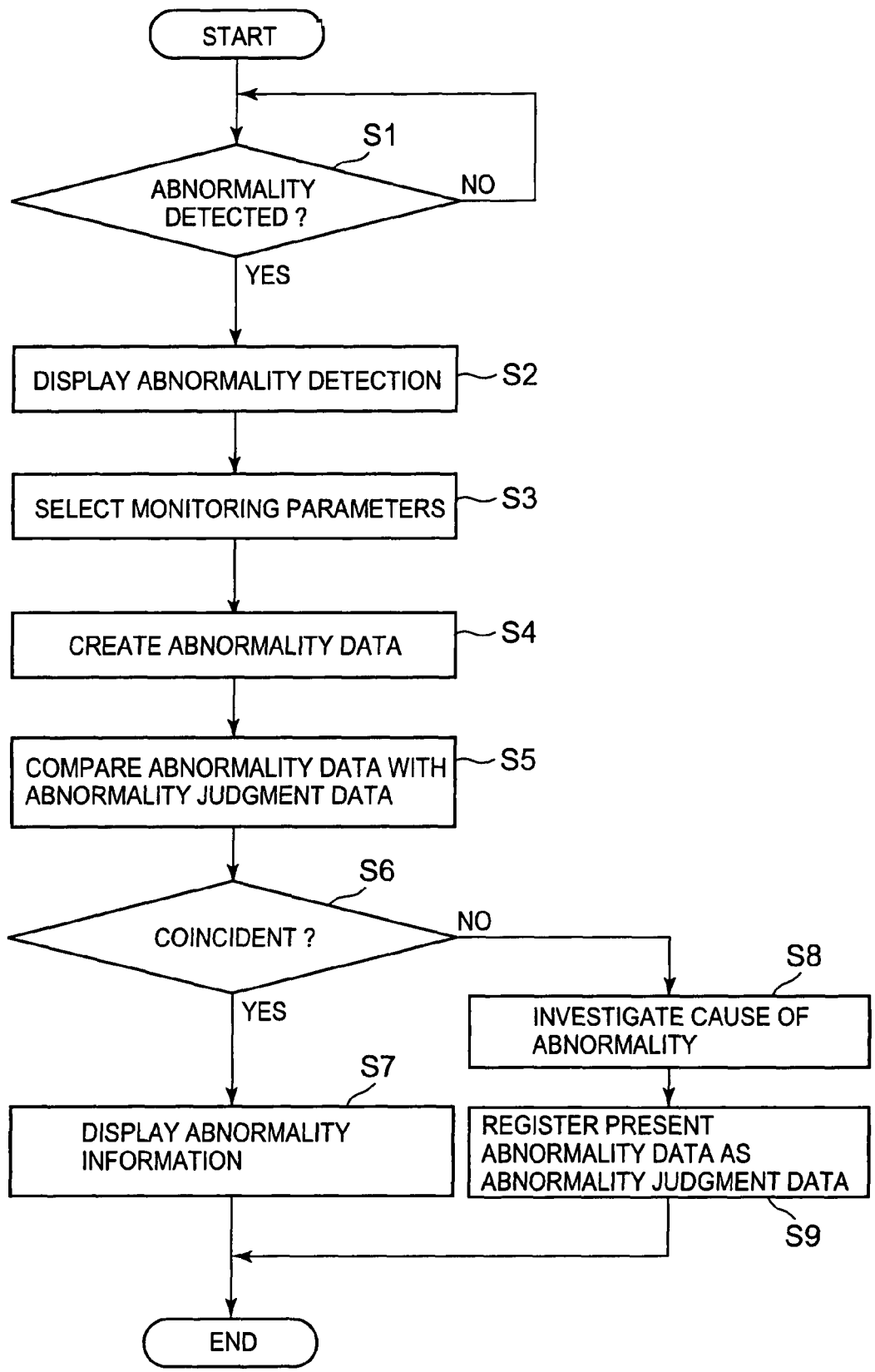
FIG. 13 is a flow chart illustrating procedures for investigating a cause of abnormality.

A monitoring process executed by the controller 3B while the main part 100 of semiconductor manufacturing apparatus is being operated will be described below with reference to the flowchart of FIG. 13. Like the first embodiment, monitoring results of each monitoring parameter are loaded into the apparatus data storage unit 32 and then stored therein. Then, abnormality detection of apparatus is performed based on the stored monitoring results. First, the abnormality detection program 41A detects an abnormality based on monitoring results loaded into the apparatus data storage unit 32 (Step S1).

Figure 14:
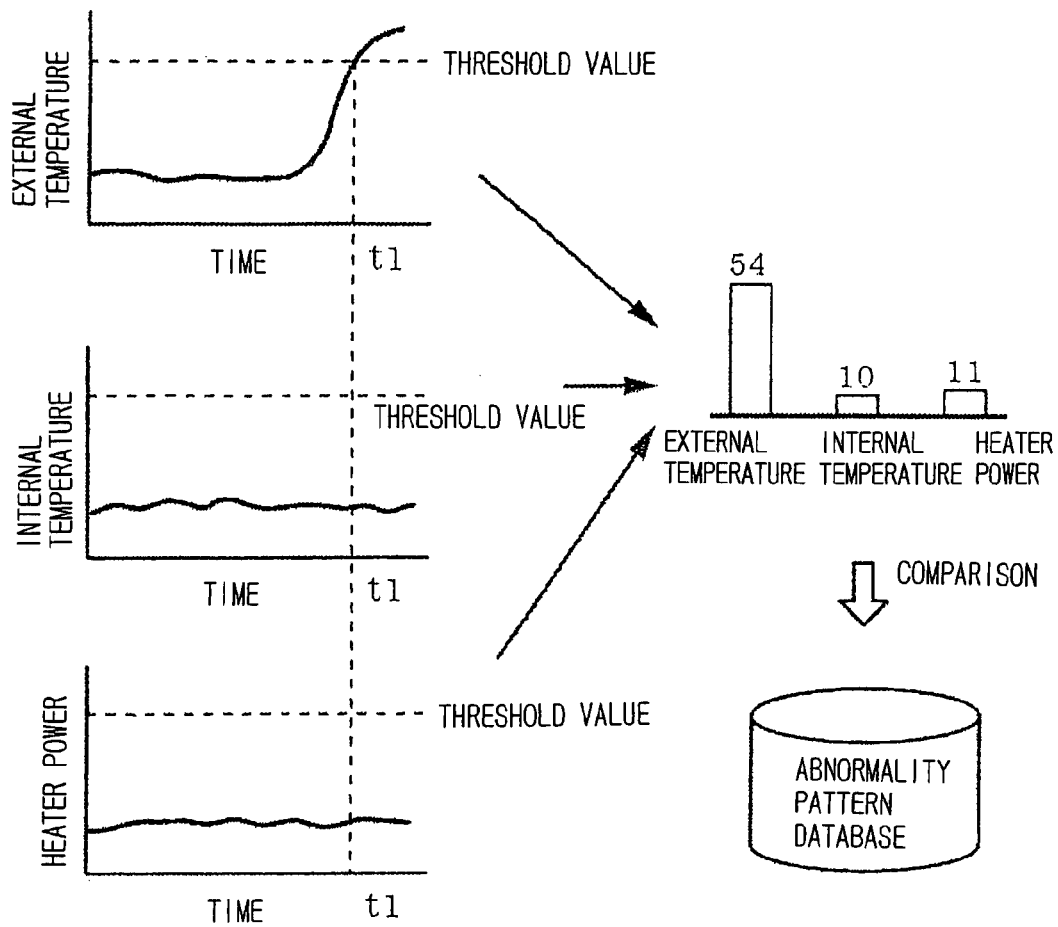
FIG. 14 is a diagram illustrating procedures for investigating a cause of abnormality.
Figure 15:
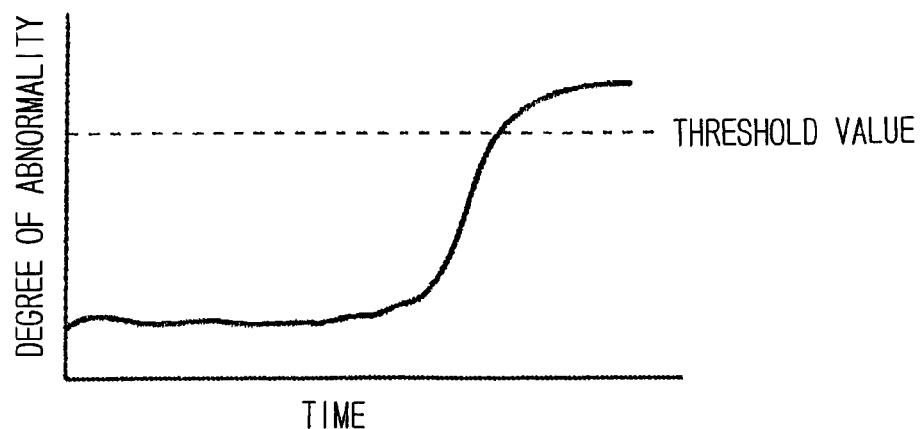
FIG. 15 is a graph illustrating an example of an abnormality detection method.

FIG. 14 is a diagram showing how an abnormality is detected. It is assumed that a detection value (detection value of external temperature) detected by one of the plurality of the external temperature sensors 10*a* has exceeded a threshold value at a point of time t1. Then, the abnormality detection program 41A determines that an abnormality has occurred. Abnormality occurrence may be determined based on whether or not the detection value of one monitoring parameter (one of temperatures measured by three external temperature sensors 10*a*) has exceeded a control value. Alternatively, abnormality occurrence may be determined according to a judgment criterion utilizing the aforementioned Mahalanobis distance, based on two or more monitoring parameters consisting of a certain monitoring parameter (for example, external temperature) and one or more monitoring parameters (for example, internal temperature and heater power) which vary in relation to said certain monitoring parameter. FIG. 15 schematically shows the latter method with which, for example, the Mahalanobis distance can be used as a degree of abnormality on the vertical axis. In comparison with the former detection method, the latter detection method is preferable because it takes into consideration a correlation between monitoring parameters.

Figure 16:
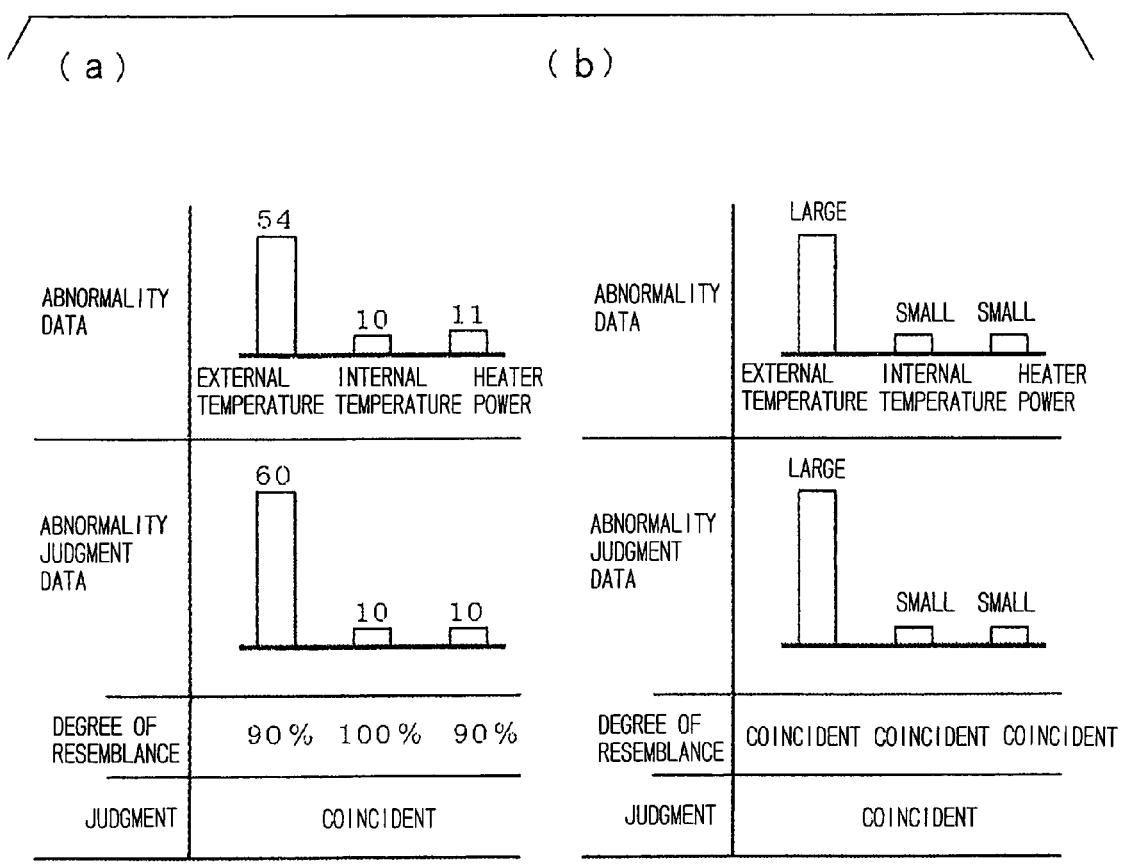
FIG. 16 is a diagram illustrating collation of abnormality data and abnormality judgment data.

If an abnormality is detected, a monitoring parameter presenting an abnormal value is displayed on the display unit 34 and at the same time the abnormality is alarmed by the abnormality alarm unit 35 (Step S2). If monitoring is performed based on multivariate analysis, a combination of monitoring parameters (in the case of FIG. 14, external temperature, internal temperature, and heater power) including abnormality is displayed on the display unit 34. Abnormality alarm is made by sounding an alarm or turning on the alarming light. Subsequently, the operator looks at the display unit 34 and then selects a combination of at least two monitoring parameters (for example, external temperature, internal temperature, and heater power) relating to the abnormality (Step S3). FIG. 16 schematically shows a screen used by the operator to select a combination of monitoring parameters.

If a combination of monitoring parameters has been selected and the "SEARCH" soft switch (refer to FIG. 17) on the screen of the display unit 34 is turned ON, the abnormality data creation program 42A standardizes the detection value of each monitoring parameter in the foregoing manner to create the abnormality data shown on the right-hand side of FIG. 17 (Step S4). Abnormality data is stored in the first storage unit 5 and at the same time abnormality data (abnormality data patternized as shown in the right-hand side of FIG. 17) is displayed on the screen of the display unit 34.

Then, the search program 43A searches, from abnormality judgment data stored in the second storage unit 6, abnormality judgment data that includes abnormality data coinciding with the abnormality data stored in the first storage unit 5. In detail, as shown in FIG. 14, the search program 43A compares the abnormality data stored in the first storage unit 5 (i.e., abnormality data made based on actual monitoring results) with the abnormality data in the abnormality judgment data in the second storage unit 6 (Step S5), and determines whether or not there exists in the second storage unit 6 such abnormality judgment data that includes abnormality data coinciding with the abnormality data stored in the first storage unit 5 (Step S6). As mentioned above, "coincidence" means a resemblance at a predetermined degree or more.

In the example of FIG. 16(a), the degree of resemblance of standardized values of each of three monitoring parameters (external temperature, internal temperature, and heater power), e.g., a ratio of a smaller value to a larger value, is 90%, 100%, and 90%. For example, if a threshold value of the degree of resemblance is 80%, the degree of resemblance exceeds 80% for all the three parameters and therefore both abnormality data are judged to be in coincidence with each other. A method of determining the degree of resemblance is not limited to the present method.

It is, not necessary that each monitoring parameter constituting abnormality data is digitized in detail (for example, [54, 10, 11]), as shown in FIG. 16(a). For example, as shown in FIG. 16(b), if a standardized detection value of monitoring parameter is larger than a certain reference value, data is judged to be "Large"; otherwise, it is judged to be "Small." For example, abnormality data can be configured with a combination of "external temperature: large", "internal temperature: small", and "heater power: large." In this case, if the pattern of abnormality data based on actual monitoring results coincides with the pattern of abnormality data in the abnormality judgment data, as shown in FIG. 16(b), both abnormality data are judged to be in coincidence with each other. Specifically, the example shown in FIG. 16(b) further evaluates standardized detection values of monitoring parameters by use of a threshold value and utilizes a combination of evaluation results as abnormality data.

As mentioned above, if such abnormality judgment data that includes abnormality data coinciding with abnormality data made based on actual monitoring results is detected, the abnormality judgment data (refer to FIG. 12) is displayed on the display unit 34 (Step S7), thereby allowing the operator to estimate the cause of the abnormality. Furthermore, the countermeasure against the abnormality is also displayed on the display unit 34. The operator may take the countermeasure as displayed, or take more appropriate countermeasures with reference to the displayed countermeasure.

On the other hand, if any coincident data is not found, the operator investigates the cause of the abnormality receiving support from, for example, a customer engineer of the apparatus maker (Step S8). After identifying the cause of abnormality and taking countermeasure against the abnormality, the operator registers the present abnormality data and various of information relevant thereto in the second storage unit 6 as new abnormality judgment data through the pattern registration program 44A (Step S9). FIG. 17 schematically shows screen display of the display unit 34 for performing that registration. After inputting the same sort of information as that shown in FIG. 3, such as abnormality data (refer to the top right of the screen) and abnormality status and cause of the abnormality (refer to the bottom left of the screen) and attaching a data code (refer to the top right of the screen), each registration switch (refer to the bottom right of the screen) on the screen is set to ON to perform registration.

According to the third embodiment, since the cause of abnormality occurrence is identified by comparing the pattern of abnormality data made based on actual monitoring results with the pattern of abnormality data in the abnormality judgment data, it is possible to easily estimate the cause of the abnormality. Furthermore, since the countermeasure against the abnormality is also provided, it is possible to easily determine countermeasures against the cause of abnormality and address the abnormality exactly and promptly.

Fourth Embodiment

A fourth embodiment will be described below with reference to FIGS. 19 to 21. Semiconductor manufacturing apparatus in the fourth embodiment is provided with the batch size selection function like the foregoing second embodiment. For the batch size selection function and the variation of required opening of the pressure control valve involved in the change of the batch size, refer to the description of the second embodiment. In the fourth embodiment, a controller 3C is configured so as to predict whether or not the pressure control valve 25 can properly control the pressure in deposition process to be performed from now based on the correlation between the cumulative film thickness and the valve angle.

The controller 3C in the fourth embodiment will be described below with reference to FIG. 19. Functions of the communication unit 31, the apparatus data storage unit 32, the input operation unit 33, the display unit 34, the abnormality alarm unit 35, and the cumulative film thickness management unit 36 are the same as those of units having the same names in the first embodiment.

The process recipe selection unit 38 is means for selecting a process recipe to be used for deposition process to be performed from now, from among a plurality of process recipes each defining process conditions. When the operator calls the process recipe selection unit 38, a list of process recipes stored in the process recipe selection unit 38 shown in FIG. 19 is displayed on the screen of the display unit 34. The list is displayed on the screen in a form of a table in which the process recipe number and process conditions corresponding thereto are described. The operator selects a desired process recipe from the list. Process conditions defined by a process recipe include batch size, process pressure, gas flow rate, process temperature, target film thickness, etc.

In this example, the process recipe selection unit 38 is configured to play a role of means for storing process recipes as well as means for manually selecting a process recipe.

However, the process recipe selection unit 38 may be provided with a function to receive information about the batch size from a processing apparatus that has performed a process immediately before the deposition process to be performed in this processing apparatus from now, and a function to automatically select the batch size.

A program storage unit 4B in the fourth embodiment includes a data processing program 41B and a judgment (abnormality prediction) program (judgment means) 42B.

The data processing program 41B is configured so as to execute a step of writing and storing previous process data including values (for example, evaluation values thereof) of valve angle loaded into the apparatus data storage unit 32 in each RUN and values of cumulative film thickness managed by the cumulative film thickness management unit 36 in the process data storage unit 40A in a predetermined format. As shown in FIG. 19, described in the process data storage unit 40A for each RUN are: the date and the time at which the RUN was performed; the process recipe number used in the RUN; the value of the valve angle $b_1, b_2, \ldots, b_n$ (the foregoing "evaluation value" is preferably used as the value) in the RUN; and the value of cumulative film thickness $c_1, c_2, \ldots, c_n$ at the end of the RUN. Note that, if the process recipe number is specified, the process conditions, especially the process pressure, are specified. Therefore, it may be deemed that the valve angle (the angle of the valve element 20 of the pressure control valve 25) is stored in the process data storage unit 40A in relation to the process pressure.

The judgment program 42B is provided with a function to predict a valve angle in the present deposition process based on previous process data corresponding to process conditions of the present deposition process (i.e., previous process data obtained when deposition process according to the same process recipe as the process recipe selected this time was performed) stored in the process data storage unit 40A and the value of the cumulative film thickness at the end of the present deposition process, and a function to judge whether or not the predicted value exceeds a permissible limit value (threshold value).

Permissible limit values may be stored, for example, in the apparatus data storage unit 32. The judgment program 42B is configured so as to instruct the abnormality alarm unit 35 to perform abnormality alarming if the judgment program 42B judges that the predicted value of the valve angle exceeds a predetermined permissible limit value. In this case, the judgment program 42B may be provided with a function to generate such a control signal that disallows soft switches on the display unit 34 to be set to ON so as to prevent input of an operation start command.

The operation of the fourth embodiment will be described below. When the process recipe for a deposition process to be performed from now is selected by the process recipe selection unit 38, the deposition process is performed like the first embodiment based on process conditions defined by the selected process recipe.

Figure 19:
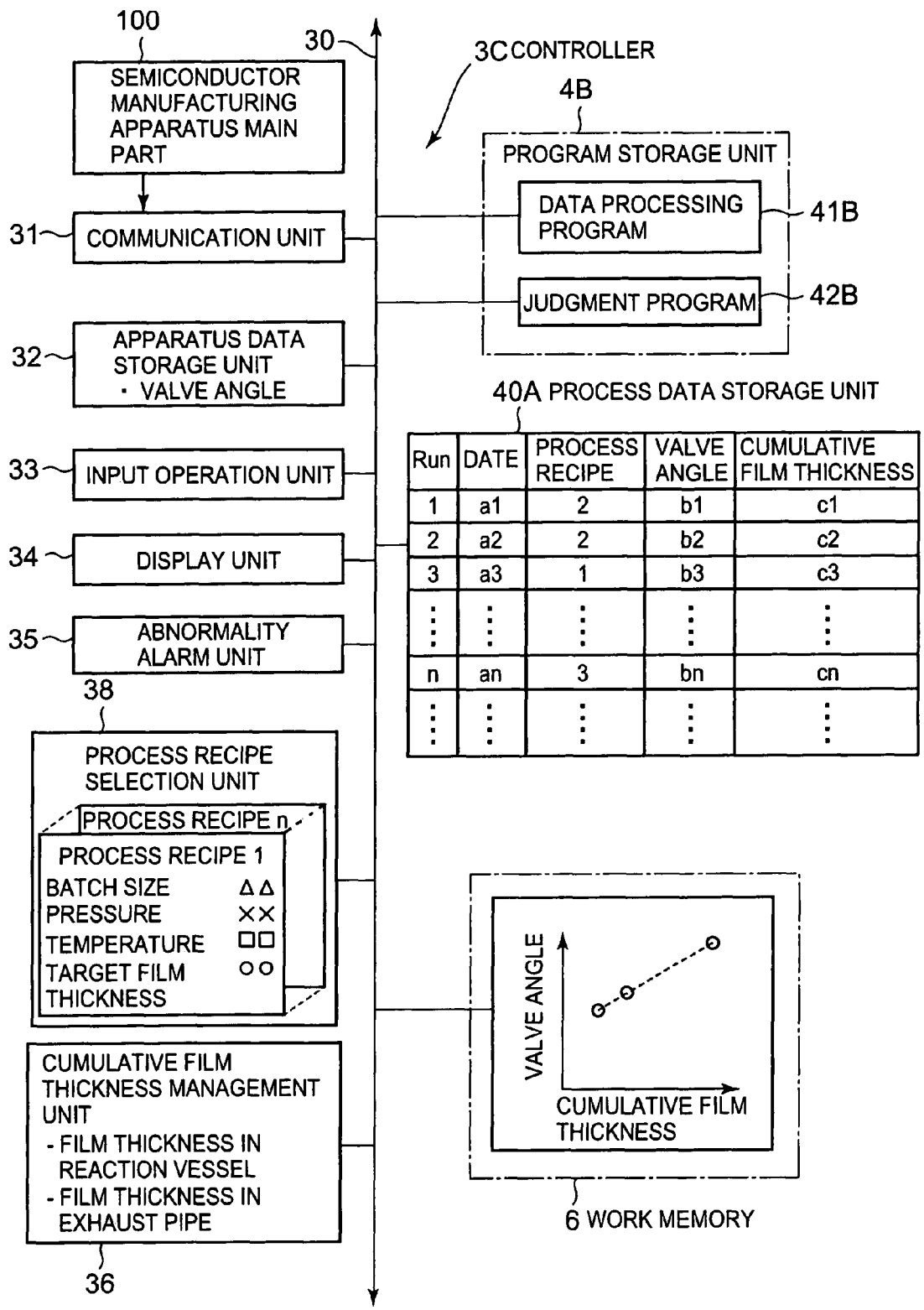
FIG. 19 is a block diagram showing a configuration of a controller in a fourth embodiment of the present invention.

Data are written into the process data storage unit 40A in the format shown in FIG. 19 for each RUN. Data-writing operation is performed by the data processing program 41B based on the apparatus data stored in the apparatus data storage unit 32, the data managed by the cumulative film thickness management unit 36, etc. The judgment program 42B judges whether or not it is possible to perform the next batch process, for which the valve angle predictive operation is performed, based on the data stored in the process data storage unit 40A with the use of a work memory 6.

Figure 20:
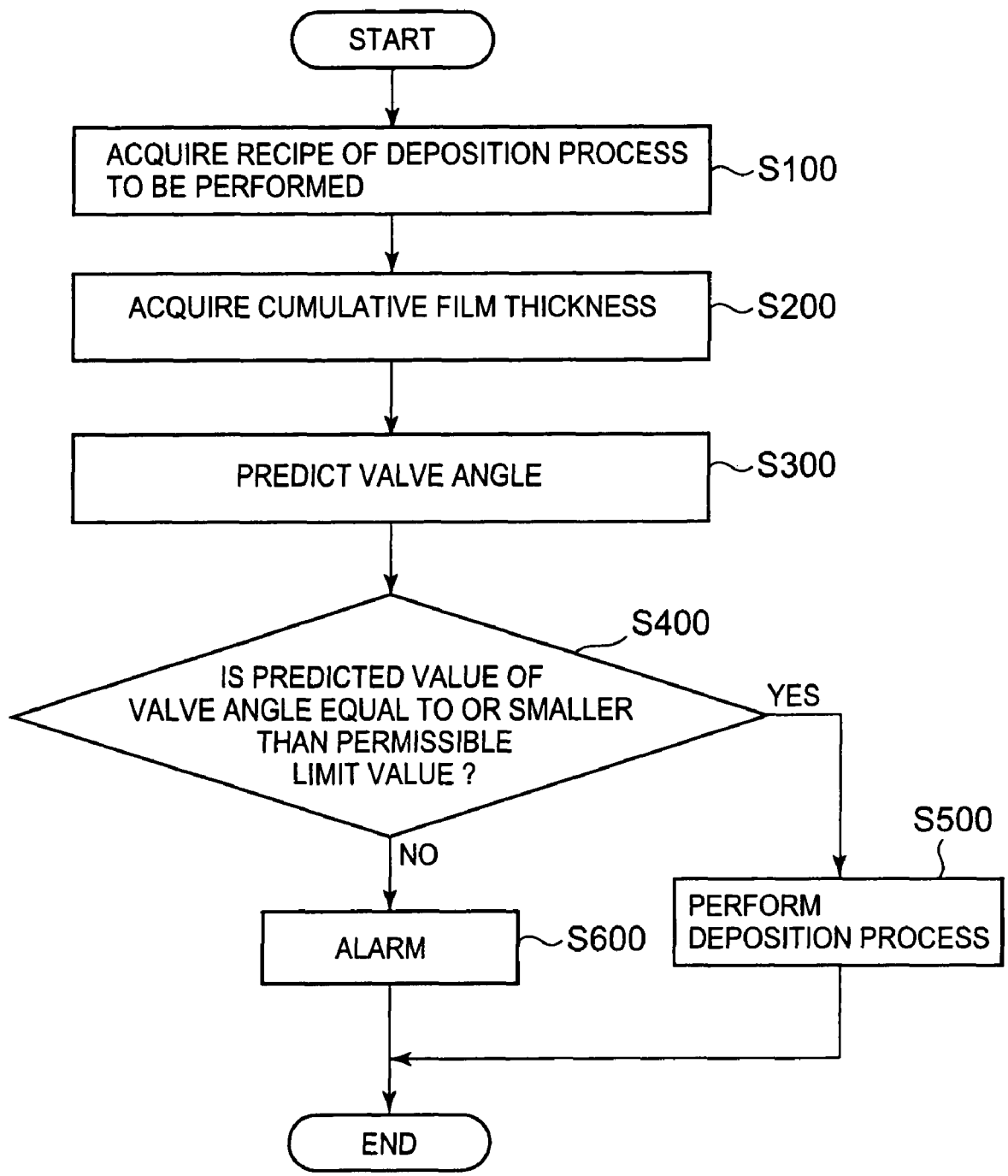
FIG. 20 is a flow chart illustrating procedures for a series of processes relating to the prediction of valve angle.

FIG. 20 shows a flow chart for judging whether or not the valve angle exceeds a threshold value (control value) by the judgment program 42B. First, the recipe number (recipe information) of the present deposition process (RUN) is acquired (Step S100). Subsequently, values of cumulative film thickness up to the last RUN are acquired from the cumulative film thickness management unit 36 (Step S200). Then, a valve angle in the present deposition process is predicted based on data of a combination of the valve angle and the cumulative film thickness of a plurality of (for example, last two) RUNs that have previously been performed under the same process conditions as the present deposition process and the target film thickness of the present deposition process (Step S300).

Then, the judgment program 42B judges whether or not the foregoing predicted value is not larger than a permissible limit value of the valve angle (Step S400). If the predicted value is not larger than the permissible limit value of the valve angle, deposition process is performed (Step 500). If the predicted value exceeds the permissible limit value of the valve angle, the abnormality alarm unit 35 generates, for example, an alarm to notify the operator of the abnormality (Step S600). Furthermore, inputting of the operation start command may be prevented at this time.

Steps S300 and S400 will be described below in detail. As shown in FIG. 21, the judgment program 42B plots previous data read out from the process data storage unit 40A on a biaxial coordinate system having a horizontal axis (first axis) assigned the cumulative film thickness and a vertical axis (second axis) assigned the valve angle. At this time, data is plotted so that the process pressure in each RUN can be distinguished. In FIG. 21, the data under a certain process condition (process recipe) are plotted with a black circle and the data under other process conditions (having different batch sizes) is plotted with a white circle. FIG. 21 shows an example in which: 500 nm cumulative film thickness at the end of RUN1; 60 degree valve angle in RUN1; 600 nm cumulative film thickness at the end of RUN2; and 65 degree valve angle in RUN2. Here, a relational expression $Y=0.05X+35$ (where X is cumulative film thickness and Y is valve angle) is obtained from data regarding RUN1 and RUN2, i.e., the last two RUNs, that have previously been performed under the same process conditions as RUN4 to be performed from now. In this example, last two previous data were used and the relationship between cumulative film thickness X and valve angle Y is approximated by a linear expression to make the explanation simple, but not limited thereto. Three or more previous data may be used, and another function may be used for approximation.

At the end of RUN3 (having a different batch size from RUN1, RUN2, and RUN4) immediately before RUN4 to be performed from now, the cumulative film thickness is 900 nm. Since the target film thickness of RUN4 is 200 nm, the cumulative film thickness at the end of RUN4 will be 1100 nm. When "1100" is substituted for X in the foregoing relational expression, Y (valve angle) is 90 degrees, which is a predicted value of the valve angle in RUN4. This completes Step S300.

Figure 21:
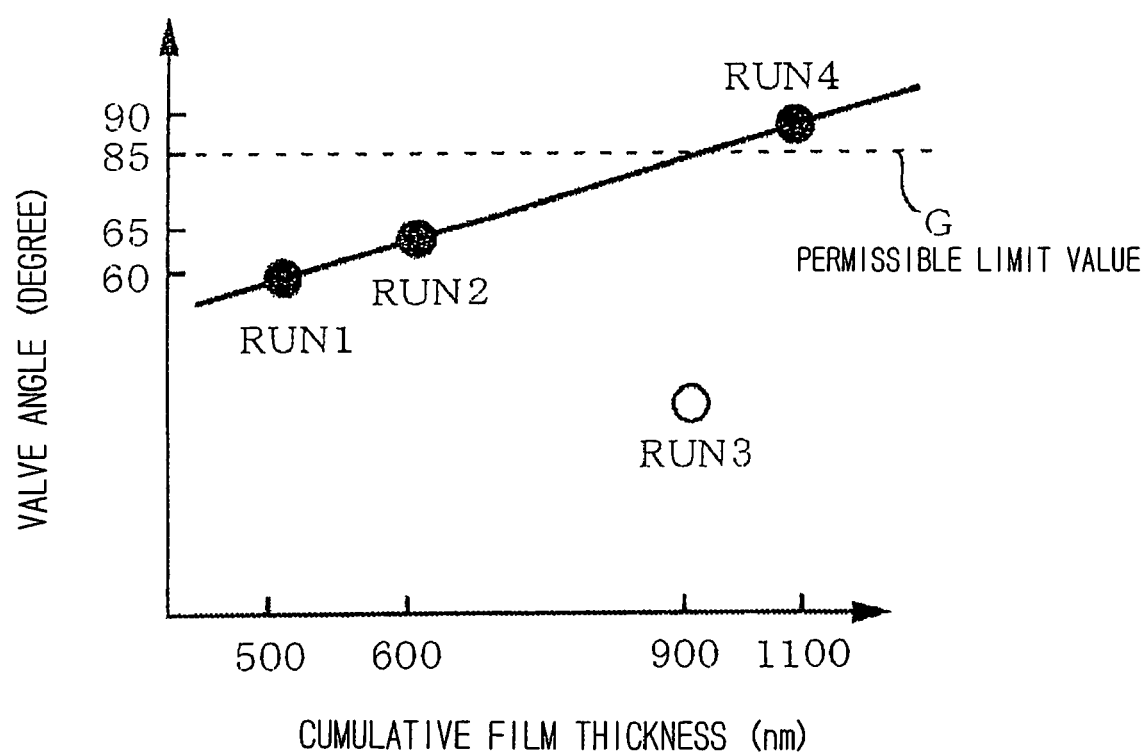
FIG. 21 is a graph illustrating a method of predicting a valve angle.

In Step S400, the judgment program 42B compares the predicted value of the valve angle with a permissible limit value G (refer to FIG. 21). Since the permissible limit value G is 80 degrees as shown in FIG. 21, it turns out that the predicted value has exceeded the permissible limit value G. In Steps S300 and S400, various arithmetic processing operations utilizing the biaxial coordinate system are performed with the use of the dedicated work memory 6 (refer to FIG. 19).

An example in which a valve angle is predicted based on the previous data obtained under plural different process conditions in which only the batch size is different has been explained above. However, it is possible to predict a valve angle using the same method even under different process conditions in which the batch sizes are the same and process conditions other than the batch size are different. If the process pressure and gas flow rate is different even though the batch size is the same, the correlation between the valve angle and the cumulative film thickness becomes different. Here, for example, it is assumed that the process pressure and the gas flow rate for the present deposition process are P1 and Q1, respectively. In this case, it is possible to predict a valve angle in the same manner as above, by reading out from the process data storage unit 40A the data of valve angle and cumulative film thickness for the last two points, from among the previous data associated with the same batch size as that of the present deposition process, a process pressure of P1, and a gas flow rate of Q1.

As mentioned above, prediction of valve angle in the present deposition process is performed based on data associated with deposition processes that have previously been performed by use of the same process recipe as that used for the present deposition process. However, it may be possible to perform prediction based on data of deposition processes that have previously been performed by use of a process recipe having partially different process conditions from that used for the present deposition process. For example, if only the process temperature is changed and other process conditions left unchanged, the correlation between the valve angle and the cumulative film thickness may remain unchanged. In this case, previous data having different process temperatures may also be used for the prediction. Such a determination may be made based on the experience of the operator. In the above description, although a valve angle is predicted based on data of the last two RUNs, the valve angle prediction may be based on data of the last three or more RUNs.

Thus, by predicting a valve angle based on previous process data, it is possible to avoid situation where pressure control is lost during deposition process. Accordingly, this prediction method can avoid a defective process, resulting in the improvement of the yield.

Furthermore, with conventional management method in which cleaning is performed when the cumulative film thickness has reached a predetermined value, it is necessary to give a certain safe margin to the control value of the cumulative film thickness. Therefore, cleaning is performed although cleaning is not required yet actually, causing a problem that the maintenance cycle becomes shorter than necessary. However, the use of the method according to the present embodiment makes it possible to exactly grasp the cleaning timing allowing such a problem to be solved.

Fifth Embodiment

Figure 22:
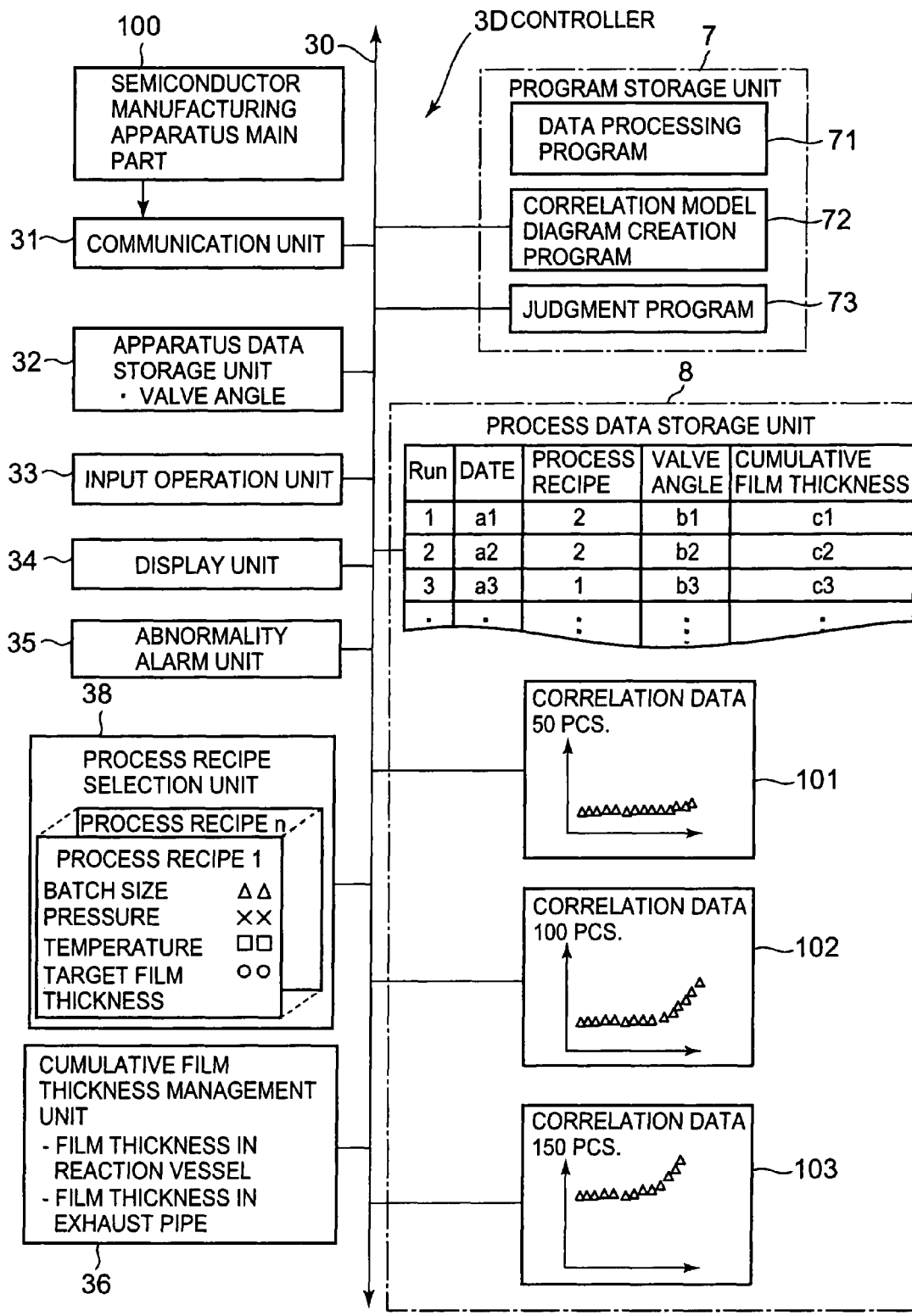
FIG. 22 is a block diagram showing the configuration of a controller in a fifth embodiment of the present invention.
Figure 23:
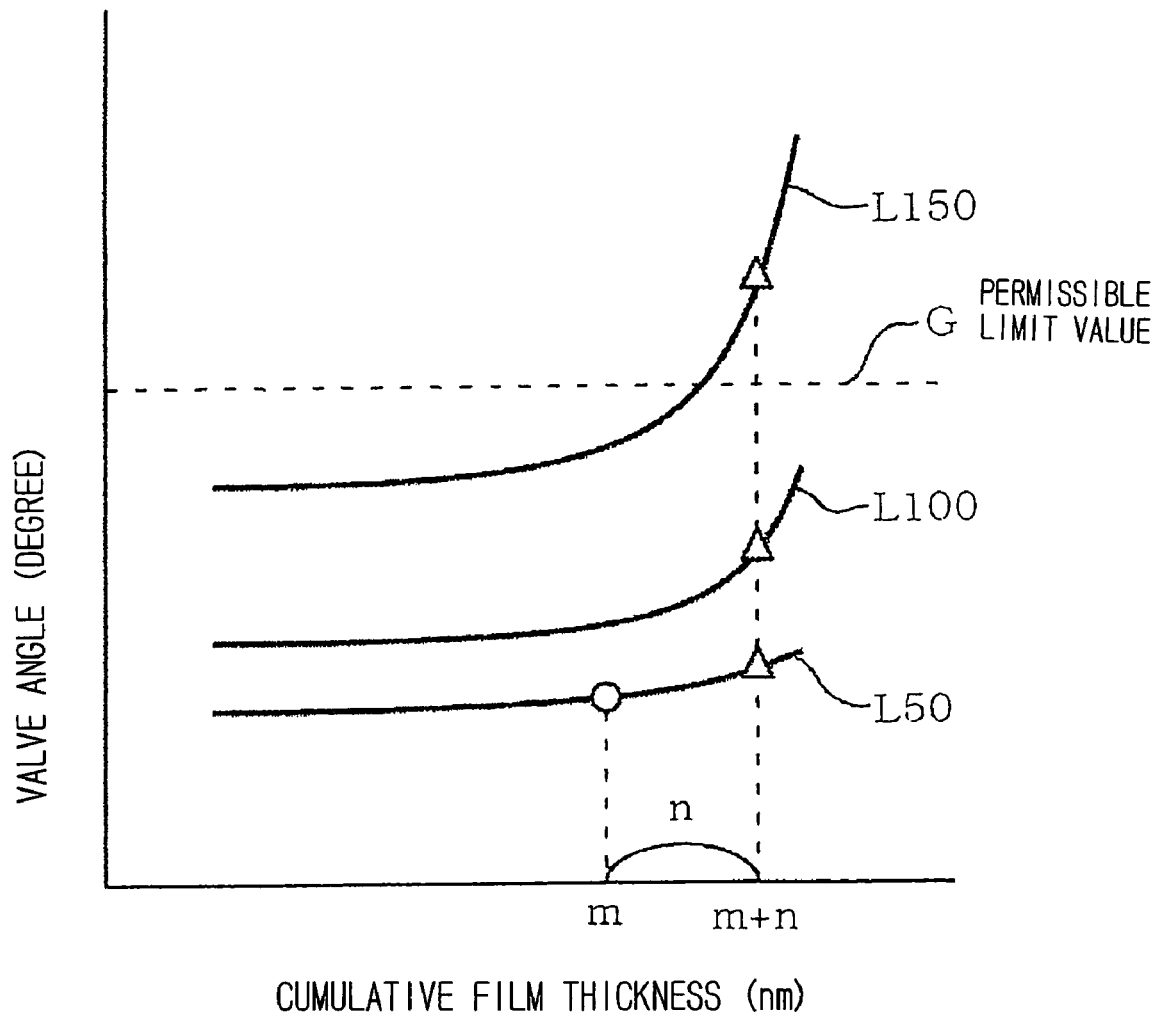
FIG. 23 is a graph illustrating another method of predicting a valve angle.

Then, a fifth embodiment will be described below with reference to FIGS. 22 and 23. Unlike the fourth embodiment, the fifth embodiment predicts a valve angle based on a correlation model diagram created for each process recipe. A configuration of a controller 3D in this embodiment is shown in FIG. 22. In FIG. 22, a component part having the same function as the component part of the controller 3C in the fourth embodiment shown in FIG. 19 is assigned the same reference numeral, and duplicated explanation will be omitted.

A program storage unit 7 includes a data processing program 71 and a correlation model diagram creation program (correlation model creation means) 72, and a judgment (abnormality prediction) program (judgment means) 73.

The data processing program 71 is configured so as to execute a step of storing previous process data 100 in the process data storage unit 8 in the same format as that used by the process data storage unit 40A in the fourth embodiment, based on the valve angle data (for example, evaluation values) obtained by the apparatus data storage unit 32 in each RUN and the cumulative film thickness data managed by the cumulative film thickness management unit 37.

The correlation model diagram creation program 72 is provided with a function to create a correlation model diagram based on the process data 100 stored in the process data storage unit 8. The correlation model diagram is stored in the process data storage unit 8. The "correlation model diagram" used here is a diagram drawn on a biaxial coordinate system having a first axis assigned the angle of the pressure control valve 25 (valve angle) necessary to achieve a certain process pressure and a second axis assigned the cumulative film thickness. The correlation model diagram is created for each process condition. In this example, a correlation model diagram is created for each of different batch sizes under the same process conditions other than the batch size (process pressure, process temperature, etc.).

A method of creating a correlation model diagram will be explained below. First, the correlation model diagram creation program 72 creates correlation data 101 to 103, on a biaxial coordinate system, for each of different batch sizes based on previous process data 100 stored in the process data storage unit 8; and displays them on the screen of the display unit 34. For the definition of "correlation data", refer also to the description of the first embodiment.

The operator selects an approximate expression from various approximate expressions, such as 2nd to 7th order function formulas and an exponential function formula, considered to be suitable for defining a relation between two parameters in each correlation data 101 to 103; and determines coefficients in the function, thereby creating a correlation model diagram. The selection of an approximate expressions and the determination of coefficients may be performed automatically by the correlation model diagram creation program 72. In FIG. 23, correlation model diagrams are described with solid bold lines, which were created based on the correlation data 101 to 103 (triangular plots) schematically shown in FIG. 22.

The judgment program 73 is configured so as to execute a step group including: (i) a step of reading out a correlation model diagram corresponding to process conditions (in this example, batch size) of the deposition process to be performed this time, and predicting a valve angle in the present deposition process based on the correlation model diagram and the value (expected value) of the cumulative film thickness at the end of the present deposition process; (ii) a step of judging whether or not the predicted value exceeds a threshold value; and (iii) a step of performing abnormality alarming to the abnormality alarm unit 35 if it is judged that the valve angle has exceeded a threshold value, for example, 80 degrees.

The operation of the fifth embodiment will be described below. Every time when a recipe selected by the process recipe selection unit 38 is executed, various apparatus data are stored in the apparatus data storage unit 32. Previous process data are recorded in the process data storage unit 8 in the format shown in FIG. 21.

The correlation model creation program 72 creates a correlation model diagram corresponding to process conditions of deposition process based on the data stored in the process data storage unit 8. FIG. 23 shows an example in which correlation model diagrams are created for each of different batch sizes of 50, 100, and 150. The judgment program 73 judges whether or not the following batch processing can be performed based on these correlation model diagrams. A correlation model diagram may be created using data obtained in another low-pressure CVD apparatus of the same model.

The judgment program 73 predicts a valve angle and judges whether or not deposition operation is possible according to the flowchart shown in FIG. 20 previously explained in relation to the fourth embodiment. The flow executed by the judgment program 73 in the fifth embodiment differs from that executed by the judgment program in the fourth embodiment only in the details of Step S300. Thus, when executing Step S300 shown in FIG. 20, the judgment program 73 reads out correlation model diagrams made based on the same process conditions as those of the present deposition process from the process data storage unit 8. The judgment program 73 then reads out a valve angle on a correlation model diagram corresponding to the cumulative film thickness at the end of the present deposition process (sum of the obtained cumulative film thickness and the target film thickness), in other words, the position of [cumulative film thickness at the end of the present deposition process, valve angle] on the above-mentioned biaxial coordinate system. The value thus read out is a predicted value of the valve angle during deposition process to be performed this time. Steps following Step S300 will be executed based on this predicted value.

Step 300 executed by the judgment program 73 will specifically be explained below with reference to FIG. 23. In FIG. 23, reference signs L50, L100, and L150 respectively denote correlation model diagrams for batch sizes of 50, 100, and 150, respectively. Here, it is assumed that the previous deposition process was performed with a batch size of 50, and a deposition process will be performed from now with a batch size of 150. First, a cumulative film thickness "m" at the end of the previous deposition process and a target film thickness "n" of the present deposition process are added to obtain a cumulative film thickness "m+n" at the end of the present deposition process. Then, a valve angle corresponding to the cumulative film thickness "m+n" is read out in the correlation model diagram L150. Then, it turns out that the valve angle has exceeded a permissible limit value (threshold value) G.

On the other hand, when the batch size of deposition process to be performed this time is 50 or 100, it turns out that the valve angle corresponding to the cumulative film thickness "m+n" in the correlation model diagrams L50 and L100 is smaller than the permissible limit value G. Thus, it turns out that deposition process can be performed with a batch size of 50 or 100.

Also in the fifth embodiment, almost the same advantageous effects as the fourth embodiment can be obtained. Note that, although a correlation model diagram is created for each of different batch sizes (process conditions) in the foregoing description, a correlation model diagram may be created for each of different other process conditions (for example, process pressure).

If a plot of newly-obtained values of the cumulative film thickness and the valve angle is not located on the correlation model diagram created based on plural previous data, the correlation model diagram may be shifted based on an amount of the dislocation of the plot of the newly obtained data, and subsequent predictions may be performed based on the shifted correlation model diagram. For example, if the above-mentioned plot is vertically dislocated from the correlation model diagram by Δy, the correlation model diagram may be shifted by Δy in the y-axis direction.

Sixth Embodiment

Next, a sixth embodiment will be described below with reference to FIGS. 24 and 25. Functions of a controller 3E in the sixth embodiment are equivalent to merged functions of the controllers 3 and 3B in the first and third embodiments, with some modifications. A function block having the same function as that constituting the controller in the first and third embodiments is assigned the same reference numeral, and duplicated explanation will be omitted.

Figure 24:
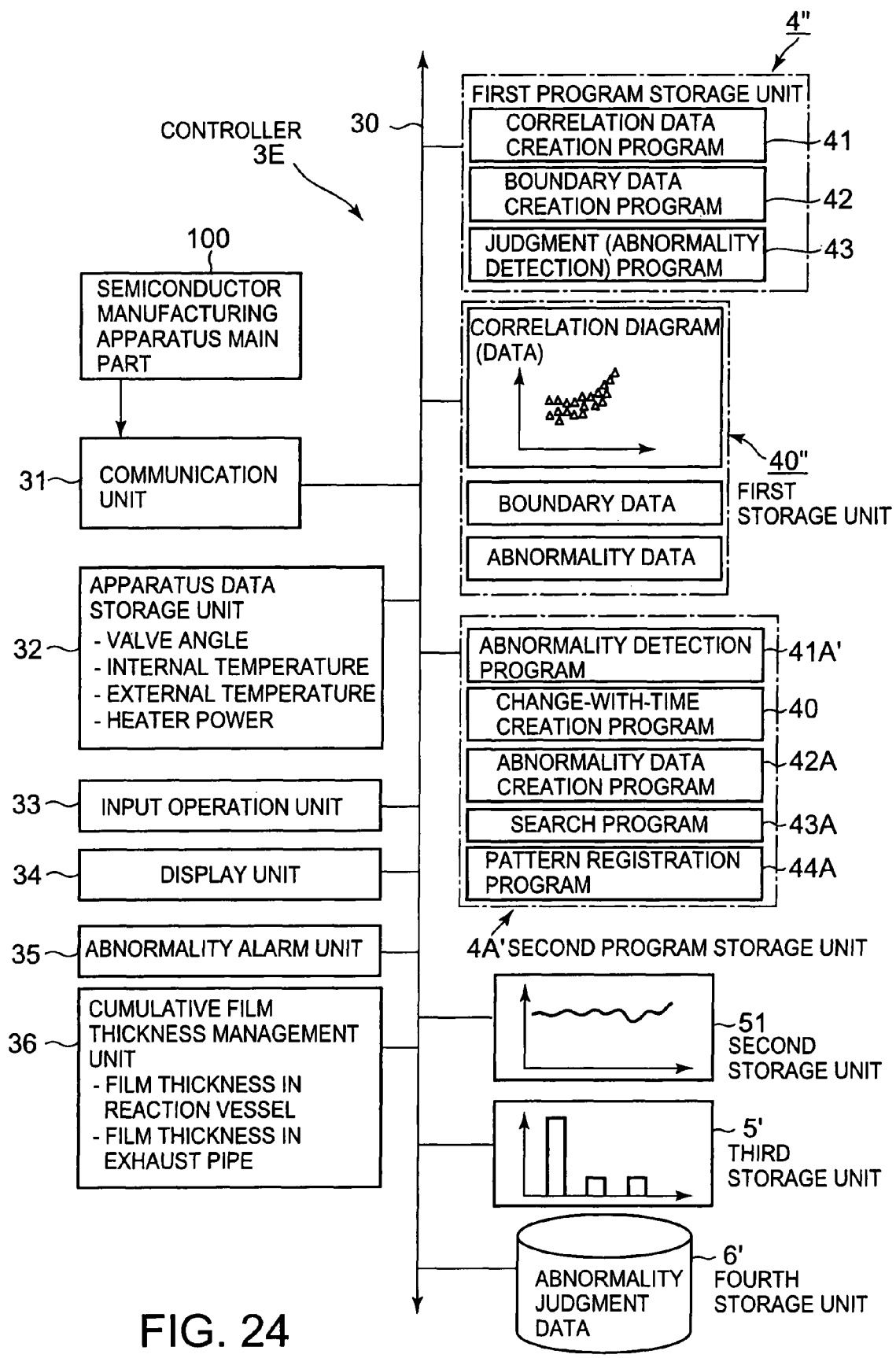
FIG. 24 is a block diagram showing a configuration of a controller in a sixth embodiment of the present invention.

As shown in FIG. 24, a first program storage unit 4" of the sixth embodiment is provided with almost the same configuration and function as the program storage unit 4 in the first embodiment. Furthermore, a first storage unit 40" is provided with almost the same configuration and function as the process data storage unit 40 in the first embodiment.

A second program storage unit 4A" in the present sixth embodiment stores a change-with-time creation program 40 in addition to the program stored in the program storage unit 4A in the third embodiment. Furthermore, an abnormality detection program 41A' in this sixth embodiment has an additional function in addition to the function of the abnormality detection program 41A in the third embodiment. In detail, the abnormality detection program 41A' includes a program portion corresponding to second abnormality detection means and a program portion corresponding to third abnormality detection means. A program corresponding to first abnormality detection means is the judgment program 43 (also referred to as "abnormality detection program") stored in the first program storage unit 4".

A program portion corresponding to the foregoing second abnormality detection means obtains the Mahalanobis distance and, if its value exceeds a threshold value, judges that an abnormality is detected, as explained in the third embodiment. A program portion corresponding to the foregoing third abnormality detection means is configured so as to determine whether or not at least one of monitoring parameters exceeds a threshold value and, if it exceeds a threshold value, determine an abnormality.

Furthermore, the change-with-time creation program 40 stored in the second program storage unit 4A' creates data of the change of the detection value of each monitoring parameter (for example, external temperature and internal temperature) with time based on the data in the apparatus data storage unit 32, and stores it in the second storage unit 51. The data of change of the detection value of monitoring parameter with time corresponds to the graph shown on the left-hand side of FIG. 14.

The abnormality data creation program (abnormality data creation means) 42A operates in the same manner as the abnormality data creation program 42A in the third embodiment, if an abnormality is detected by at least one of the abnormality detection program 41 (judgment program) of first program storage unit 4" and the abnormality detection program 41A' of the second program storage unit.

In the sixth embodiment, if an abnormality is detected by at least one of the abnormality detection programs 41 and 41A', "abnormality data" is created with operator's intervention. For procedures for creating abnormality data, refer to the description of the third embodiment.

If an abnormality judged based on boundary data for correlation data is detected, it is possible that abnormality data is not created depending on situation, because the abnormality status and the cause of the abnormality may become clear based only on boundary data in some cases, as previously described in the first embodiment.

Although the creation of abnormality data is directed by the operator if an abnormality is detected in a typical embodiment, it may be possible that the abnormality data creation program 42A may have a function to automatically select a combination of monitoring results and create abnormality data when an abnormality is detected.

In the sixth embodiment, the abnormality detection function for each individual detection value (abnormality detection function by the third abnormality detection means of the abnormality detection program 41A') can be omitted. Thus, it may be possible to create failure data with operator's intervention if at least one of an abnormality judged with reference to the boundary data created based on correlation data (abnormality detected by the abnormality detection program 41) and an abnormality judged based on operation results of plural detection values (abnormality detected by the second abnormality detection means of the abnormality detection program 41A').

A controller 3E in of the sixth embodiment further includes a third storage unit 5' and a fourth storage unit 6'. The "abnormality data (refer to the third embodiment)" created by the abnormality data creation program 42A is stored in the third storage unit 5'. Thus, the third storage unit 5 in the present embodiment corresponds to the first storage unit 5 in the third embodiment. Furthermore, the fourth storage unit 6' stores "abnormality judgment data (refer to the third embodiment)" and corresponds to the second storage unit 6 of the third embodiment. Furthermore, the search program (searching means) 43A stored in the second program storage unit 4A' (also referred to as cause estimation program) is provided with the same function as the search program 43A in the third embodiment.

Next, the operation of the sixth embodiment will be explained below. The deposition process is performed in the same manner as the first embodiment. Monitoring parameters are constantly monitored during a deposition process. A flow which is almost the same as that described in FIG. 13 relating to the third embodiment is executed based on the detection values of monitoring parameters. The flow in the sixth embodiment differs from that of FIG. 13 of the third embodiment only in Step S1. That is, in the sixth embodiment, at least one or preferably a plurality of the above-mentioned three different abnormality detection procedures realized by the abnormality detection programs 41 and 41A' are performed in Step S1 for abnormality detection.

If an abnormality based on boundary data for correlation data is detected, the same procedures as the first embodiment are executed.

If an abnormality based on operation results of a plurality of detection values is detected, the same procedures as those explained with reference to FIGS. 14 and 16 in the third embodiment are executed.

Figure 25:
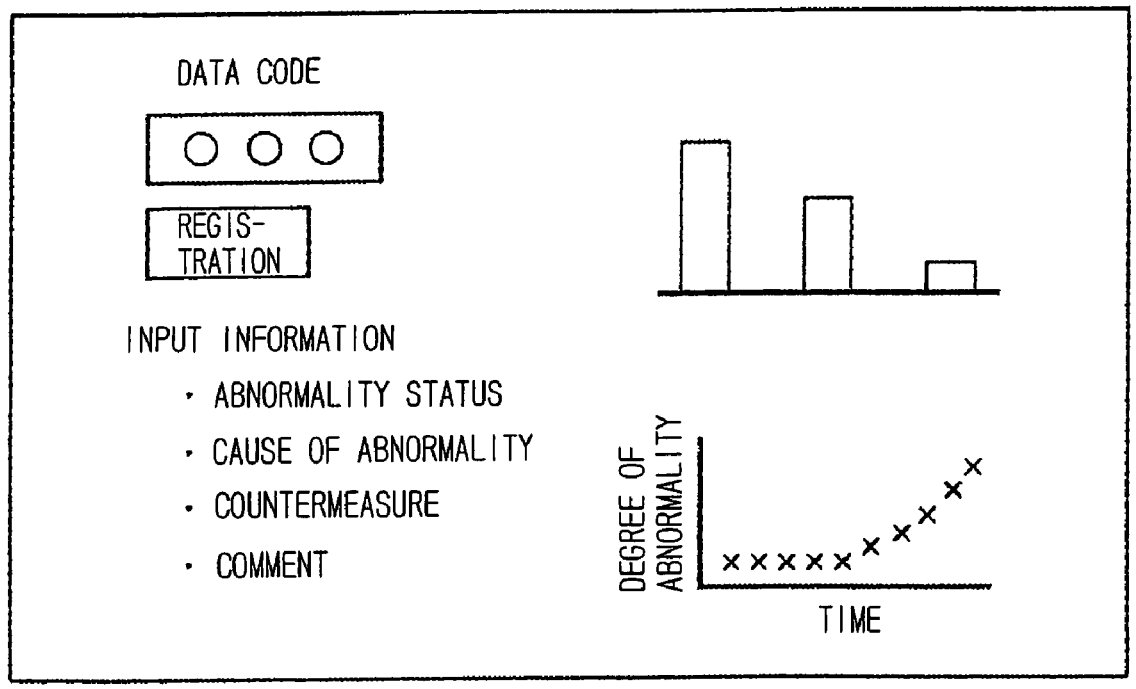
FIG. 25 is a diagram showing another example of display of a display unit when registering new abnormality judgment data.

In the sixth embodiment, when registering new abnormality judgment data, data of change in degree of abnormality with time may be registered together, as shown in FIG. 25.

The present invention has been explained above based on various embodiments, but not limited thereto. For example, abnormality detection or abnormality prediction according to the present invention are not limited to the foregoing batch-type, low-pressure CVD apparatus, but may be applied to various semiconductor manufacturing apparatuses, such as a normal pressure (including a slightly-reduced pressure slightly lower than the atmospheric pressure) deposition apparatus, a single-wafer thermal processing apparatus, a dry etching apparatus, an ashing apparatus, a resist coating and development apparatus, etc.

What is claimed is:

1. A semiconductor deposition apparatus that includes a reaction vessel and is configured to perform a deposition process on substrates in the reaction vessel to fabricate a semiconductor device, said apparatus comprising:

a boundary data storage unit that stores boundary data defining a boundary between a normal region and an abnormal region on a biaxial coordinate system, the coordinate system having a first axis and a second axis respectively assigned a first monitoring parameter and a second monitoring parameter that varies according to a correlation with the first monitoring parameter;

first and second monitoring means for monitoring the first and second monitoring parameters, respectively;

batch size selection means for selecting a batch size which represents the number of substrates processed by a single process in the reaction vessel;

judgment means for judging whether a position, on the biaxial coordinate system, of a combination of values of the first and second monitoring parameters respectively obtained by the first and second monitoring means is included in the normal region or in the abnormal region; and abnormality alarming means for alarming that there exists an abnormality in the semiconductor deposition apparatus if the judgment means determines that the position is included in the abnormal region, wherein the first monitoring parameter is a cumulative film thickness which represents the sum of the thickness of films which have been deposited in the reaction vessel, and the second monitoring parameter is an opening of a pressure control valve which is arranged in a vacuum exhaust path to control pressure in the reaction vessel;

the boundary data storage unit stores a plurality of boundary data respectively corresponding to different batch sizes;

the judgment means is configured to make a judgment based on boundary data corresponding to a selected batch size; and if the judgment means determines that the position is included in the abnormal region, the abnormality alarming means is configured to alarm that the air-tightness of the reaction vessel is insufficient or that cleaning is necessary.

2. The semiconductor deposition apparatus according to claim 1, further comprising:

correlation data creation means for creating correlation data representing a correlation between the first and second monitoring parameters on the biaxial coordinate system based on a number of combinations of corresponding values of the first and second monitoring parameters obtained when the semiconductor deposition apparatus is in a normal condition; and boundary data creation means for creating boundary data that defines the boundary between the normal region and the abnormal region on the biaxial coordinate system based on correlation data created by the correlation data creation means.

3. The semiconductor deposition apparatus according to claim 2, further comprising an apparatus data storage unit that stores a history of the apparatus status parameters, wherein the correlation data creation means is configured to create the correlation data based on the apparatus status parameters corresponding to the first and second monitoring parameters stored in the apparatus data storage unit.

4. The semiconductor deposition apparatus according to claim 2, further comprising display means for displaying the correlation data.

5. The semiconductor deposition apparatus according to claim 4, wherein the display means is configured to display the correlation data and the boundary data on a single common biaxial coordinate system.

6. The semiconductor deposition apparatus according to claim 2, wherein the boundary data creation means includes means for selecting an approximate expression for defining the boundary; and means for calculating coefficients in the approximate expression based on the correlation data and the selected approximate expression.

7. The semiconductor deposition apparatus according to claim 1, further comprising:

a heater composed of a resistance heating element provided around the reaction vessel to heat an inside of the reaction vessel; and a temperature sensor that detects a temperature of the heater.

8. A method of detecting an abnormality of a semiconductor deposition apparatus that includes a reaction vessel and is configured to perform a deposition process on substrates in the reaction vessel, comprising the steps of:

acquiring a value of a first monitoring parameter and a value of a second monitoring parameter which varies according to a correlation with the first monitoring parameter;

selecting one of a plurality of boundary data that respectively corresponds to a specific batch size to be processed;

applying the acquired values of the first and second monitoring parameters to the selected boundary data that specifies a boundary between a normal region and an abnormal region on a biaxial coordinate system having a first axis and a second axis respectively assigned the first and second monitoring parameters;

judging whether a position of the acquired values of the first and second monitoring parameters are included in the normal region or the abnormal region of the selected boundary data on the biaxial coordinate system; and alarming that there exists an abnormality in the semiconductor deposition apparatus if the judgment means judges that the positions of the acquired values are included in the abnormal region, wherein the first monitoring parameter is a cumulative film thickness which represents the sum of the thicknesses of films which have been deposited in the reaction vessel and the second monitoring parameter is an opening of a pressure control valve which is arranged in a vacuum exhaust path to control pressure in the reaction vessel, and the alarming step includes an alarm that signals that airtightness of the reaction vessel is insufficient or that cleaning is necessary.

9. A storage medium storing a computer program therein, wherein when a computer connected to the semiconductor deposition apparatus executes the computer program, the computer controls the semiconductor deposition apparatus to perform the method according to claim 8.

* * * * *